United States Patent [19]
Miyawaki

[11] Patent Number: 5,717,473
[45] Date of Patent: Feb. 10, 1998

[54] LIQUID CRYSTAL DISPLAY HAVING POWER SOURCE LINES CONNECTED TO THE WELLS OF THE TFTS

[75] Inventor: Mamoru Miyawaki, Isehara, Japan

[73] Assignee: Canon Kabushiki Kaisha, Tokyo, Japan

[21] Appl. No.: 362,982

[22] Filed: Dec. 23, 1994

[30] Foreign Application Priority Data

Dec. 28, 1993 [JP] Japan ............................ 5-337495

[51] Int. Cl.$^6$ .......................... G02F 1/136; G02F 1/1343
[52] U.S. Cl. ................................................ 349/43; 349/39
[58] Field of Search ........................... 359/59; 349/41, 349/42, 43

[56] References Cited

U.S. PATENT DOCUMENTS

| | | | |
|---|---|---|---|
| 4,319,237 | 3/1982 | Matsuo et al. | 359/59 |
| 5,250,835 | 10/1993 | Izawa | 257/408 |
| 5,305,128 | 4/1994 | Stupp et al. | 359/87 |
| 5,410,172 | 4/1995 | Koizumi et al. | 257/347 |
| 5,412,240 | 5/1995 | Inoue et al. | 257/347 |
| 5,483,366 | 1/1996 | Atherton | 359/59 |
| 5,546,204 | 8/1996 | Ellis | 257/59 |

FOREIGN PATENT DOCUMENTS 0457328  11/1991  European Pat. Off. .
63-316027 12/1988 Japan .
2-178965   7/1990 Japan .

OTHER PUBLICATIONS

Patent Abstracts of Japan, vol. 14 No. 045 (E–0880), 26 Jan. 1990 & JP-A-01 276755 (Sony Corp) 7 Nov. 1989 * abstracts *.
Patent Abstracts of Japan, vol. 10 No. 186 (E–416), 28 Jun. 1986 & JP-A-61 034978 (Hitachi Ltd) 19 Feb. 1986, * abstract *.

Primary Examiner—William L. Sikes
Assistant Examiner—Charles Miller
Attorney, Agent, or Firm—Fitzpatrick, Cella, Harper & Scinto

[57] ABSTRACT

A liquid crystal display which comprises an active matrix circuit board equipped with a plurality of transistors having a plurality of pixel electrodes arranged along a plurality of lines and rows and drains connected to these pixel electrodes, scanning lines for commonly connecting gates of the transistors arranged along the lines, and signal lines for commonly connecting sources of the transistors arranged along the rows, a substrate having a facing electrode, and a liquid crystal interposed between the active matrix circuit board and the substrate the liquid crystal display being constituted so that a voltage may be applied to regions of a conductive mode which is different from a conductive mode of the sources and the drains of semiconductor layers constituting the transistors.

21 Claims, 21 Drawing Sheets

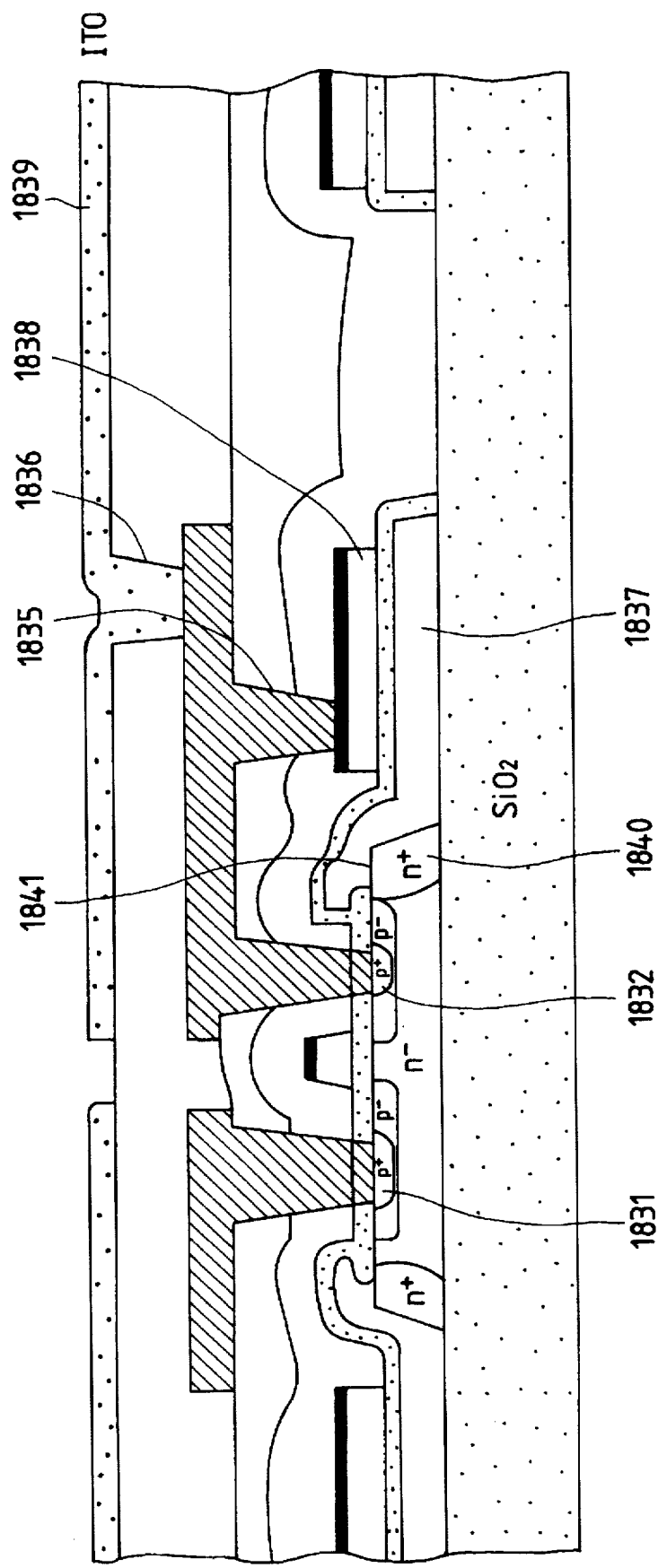

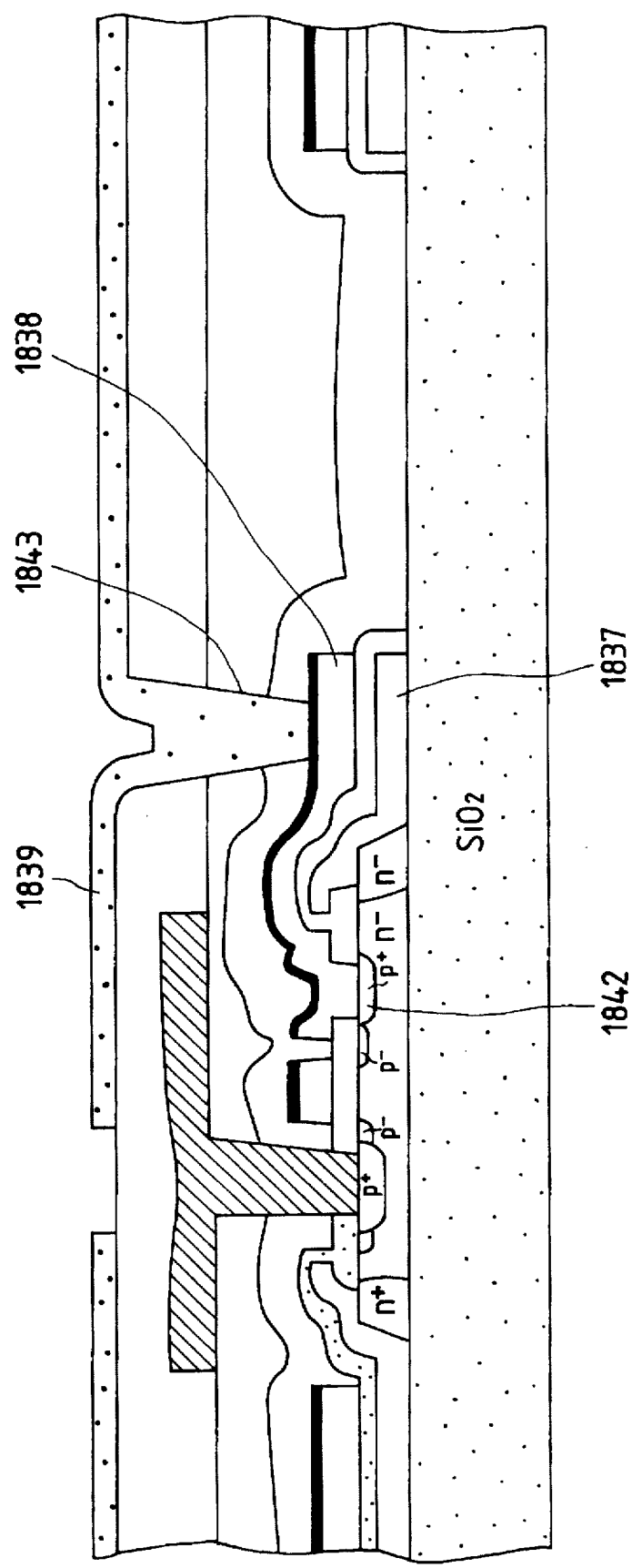

LIQUID CRYSTAL DISPLAY HAVING POWER SOURCE LINES CONNECTED TO THE WELLS OF THE TFTS

BACKGROUND OF THE INVENTION

1. Field of the Invention

The present invention relates to a liquid crystal display equipped with an active matrix circuit board.

2. Related Background Art

Heretofore, there has been suggested a liquid crystal display for displaying, for example, television images by the use of a high-density two-dimensional matrix liquid crystal display (an active matrix type liquid crystal display) in which a thin film transistor (TFT) is utilized.

Under such circumstances, as a technique for realizing a high contrast liquid display by using the active matrix type liquid crystal display, a system has been prevalent in which pixel signals are written by the use of thin film transistors (poly-Si TFTs) in which semiconductor layers comprising a polycrystalline silicon (poly-Si) are utilized.

However, the liquid crystal display in which switching elements comprising the poly-Si TFTs are used has the following problems.

(1) Since the poly-Si has a low carrier mobility, a high-speed switching operation is difficult, so that the number of the pixels for the liquid crystal display is limited, with the result that the liquid crystal display having a high resolution cannot be obtained.

(2) A leakage current flows through grain boundaries of the poly-Si between a source and a drain, and so a predetermined voltage cannot be held between pixel electrodes. In consequence; the contrast and gradation deteriorate.

(3) The size, the orientation and the like of the poly-Si grains cannot be uniformly controlled, so that they are different in the respective TFTs. Thus, the threshold values of the transistors are uneven. In addition, change in properties with time also occurs. For these reasons, it is difficult to design a circuit or a panel using the TFTs.

In order to solve the above-mentioned problems, improvement has been made, for example, by enlarging the grain size of the poly-Si to heighten the carrier mobility from a conventional level, i.e., several-tens level (n-type TFT) to tens-hundreds level.

However, if the grain size is enlarged and crystallinity is increased, the following problems occur.

(4) The life of an impact-ionized poor carrier generated by a high electric field at the drain terminal of the TFT is prolonged, and this poor carrier leads to the change of a potential in a TFT channel division, whereby the leakage current of the TFT is newly generated.

(5) Furthermore, in order to relieve the above-mentioned high electric field, a silicon (Si) layer constituting the TFT is required to be thickened, and in such a case, the leakage current caused by a defect of an Si side wall of the TFT increases. Moreover, in the case that the TFTs are used in the display, a light leakage current caused by light leaked into the pixel TFTs is more easily generated.

SUMMARY OF THE INVENTION

An object of the present invention is to provide a liquid crystal display which can solve the above-mentioned problems and which can exert a high contrast, a high gradation and a high resolution.

Another object of the present invention is to provide a liquid crystal display having a high reliability and a high yield.

Still another object of the present invention is to provide a TFT structure and its peripheral structure for realizing the liquid crystal display having the above-mentioned excellent characteristics.

The present invention has been attained by intensively conducting an investigation with the intention of solving the above-mentioned problems, and it has the constitution described below.

That is to say, according to the present invention, there is provided a liquid crystal display which comprises an active matrix circuit board equipped with a plurality of transistors having a plurality of pixel electrodes arranged along a plurality of lines and rows and drains connected to these pixel electrodes, scanning lines for commonly connecting gates of the transistors arranged along the lines, and signal lines for commonly connecting sources of the transistors arranged along the rows; a substrate having a facing electrode; and a liquid crystal interposed between the active matrix circuit board and the substrate. The liquid crystal display being constituted so that a voltage may be applied to regions of a conductive mode which is different from a conductive mode of the sources and the drains of semiconductor layers constituting the transistors.

The liquid crystal display of the present invention includes a liquid crystal display, wherein capacitors have one terminal connected to the drains of the transistors, and the other terminals not connected to the drain but connected to the regions (hereinafter also referred to as "wells") of a conductive mode different from a conductive mode of the sources and the drains of semiconductor layers constituting the transistors.

In the liquid crystal display of the present invention, a poor carrier generated in a high electric field or a light carrier generated owing to light leakage flows to a power source connected to the wells, so that the fluctuation of a well potential does not occur. In consequence, a TFT leakage current is much smaller as compared with a conventional case, so that the signal of the pixel electrodes does not change, thereby realizing a high contrast and a high gradation.

Furthermore, in the case that the terminals constituting the capacitors are connected to the drains of the transistors, the potential change of the pixel electrodes can be further prevented by the capacities, even if the similar leakage current of the TFTs is generated. In consequence, the high contrast and the high gradation can be realized.

In general, if such a constitution is employed, connections to the power source increase to deteriorate an aperture ratio. In the liquid crystal display of the present invention, however, the power source of the capacities are made common to the power source of the wells of the semiconductor layers constituting the TFTs, whereby the connections can be simplified. In consequence, the high aperture ratio can be achieved, and the clear liquid crystal display can be obtained.

Moreover, the liquid crystal display of the present invention has excellent characteristics such as a low flicker, good temperature properties, a stable operation, a clear display due to the increased aperture ratio, the enlargement of a view angle, the decrease of image deterioration by external light and a good compatibility with a panel having a large number of the pixels. In addition, when the semiconductor layers having the formed transistors comprise the poly-Si or a single crystal Si, for example, a shift register, a bias regulating circuit, a gain regulating circuit or the like can be arranged on the periphery of the liquid crystal panel, so that the manufacturing cost of the panel can be decreased.

The liquid crystal display of the present invention having the above-mentioned excellent characteristics can be applied to an electronic view finder for VTR incorporated into a camera, a display panel for a computer or a word processor, a head mounted display, a display panel for projection TV, a display panel for a meter such as an oscilloscope, a display panel for a handy terminal, a display panel for TV conference and TV telephone, and the like.

BRIEF DESCRIPTION OF THE DRAWINGS

FIG. 11B and 11C are sectional views taken along the line Y-Y' of the circuit board shown in FIG. 11A.

DETAILED DESCRIPTION OF THE PREFERRED EMBODIMENTS

Next, the present invention will be described in more detail with reference to typical examples, but the scope of the present invention should not be limited to these examples. The present invention also include conceptions in which constitutional requirements are modified or replaced in contrast to known techniques so long as the objects of the present invention can be accomplished.

EXAMPLE 1

One embodiment of a liquid crystal display of the present invention will be described with reference to FIG. 1.

Figure 1:
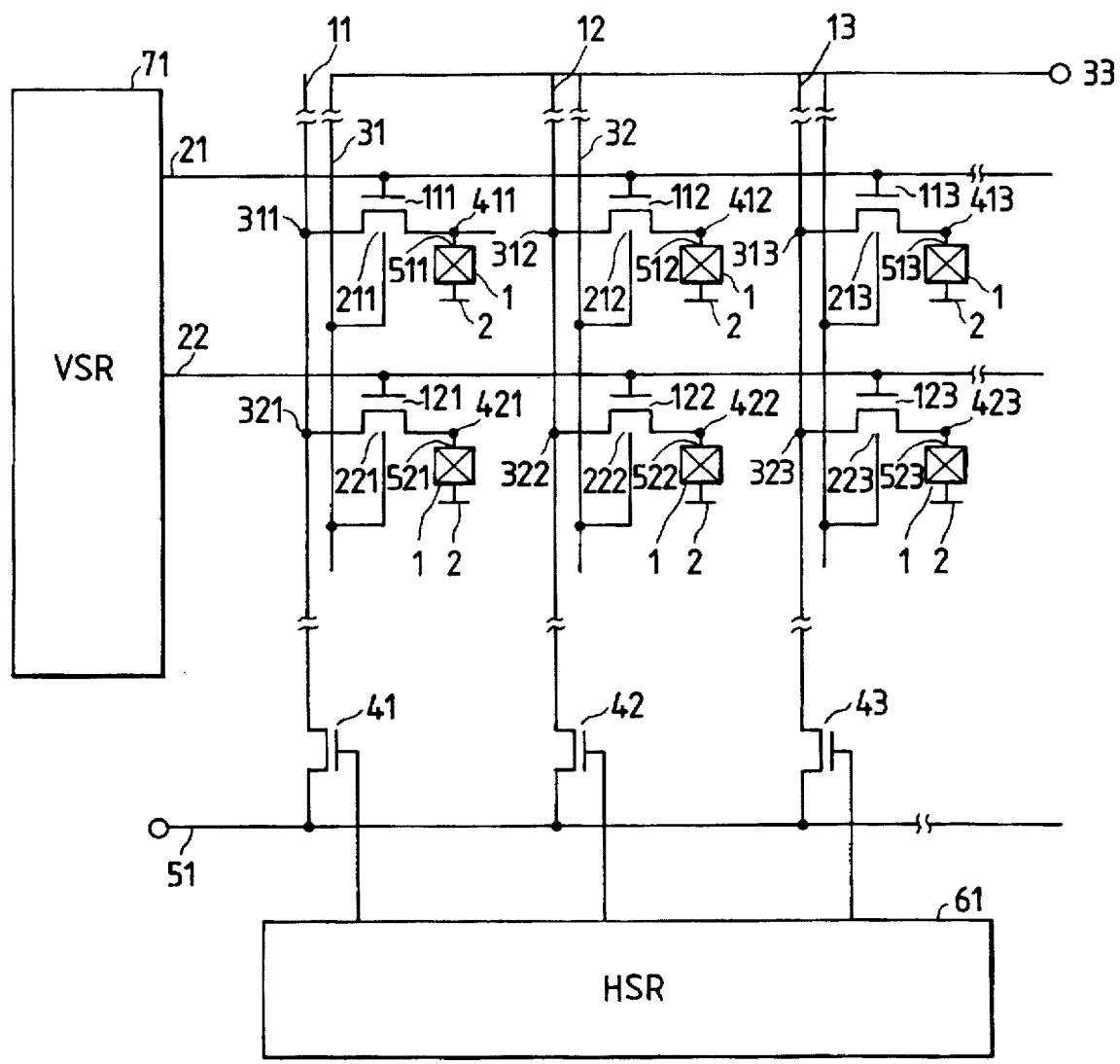
FIG. 1 is an equivalent circuit illustrating one embodiment of a liquid crystal display of the present invention.

FIG. 1 is an equivalent circuit for a liquid crystal display of the present invention. In FIG. 1, reference numeral 1 is a liquid crystal layer, numeral 2 is a facing electrode arranged on a substrate facing to an active matrix circuit board on which a TFT is placed, 11, 12 and 13 are signal lines, and 21 and 22 are scanning lines. Numerals 31 and 32 are power source lines for fixing the potential of TFT wells, and they are connected in common in a periphery of a display region and further connected to a power source terminal 33. Numerals 41, 42 and 43 are sampling transistors, 51 is a horizontal signal line, 61 is a horizontal shift register, and 71 is a vertical shift register.

Numerals 111, 112, 113, 121, 122 and 123 are gate electrodes of the TFTs placed in pixel divisions, and these gate electrodes are connected to the scanning lines 21, 22.

Numerals 211, 212, 213, 221, 222 and 223 are regions (wells) other than sources.drains of semiconductor layers constituting the respective TFTs, and these wells are connected to the power source lines 31, 32.

Numerals 311, 312, 313, 321, 322 and 323 are sources of the respective TFTs, and they are connected to the signal lines 11, 12 and 13, respectively.

Numerals 411, 412, 413, 421, 422 and 423 are drains of the respective TFTs, and they are connected to pixel electrodes 511, 512, 513, 521, 522 and 523, respectively.

With regard to the TFT, n-type (n-channel MOS) and p-type (p-channel MOS) are both usable. In the active matrix type liquid crystal display, a voltage applied between the pixel electrode and the facing electrode is usually about ±5 V, and between the source and the drain, a voltage of about 10 V is applied. Therefore, from the viewpoint of voltage resistance, the p-type TFT having a small impact ionization rate is preferable.

The operation of the liquid crystal display of this embodiment will be described. A video signal from a solid imaging device, a broadcast or the like is input to the horizontal signal line 51.

FIG. 1 shows an example in which only one horizontal signal line is present, but in the case of a color display or the like, a plurality of horizontal signal lines of desired colors for a red signal, a blue signal, a green signal and the like may be arranged.

The video signals input to the horizontal signal line 51 are selected in turn in compliance with scanning pulses from the horizontal shift register 61 by the respective sampling transistors 41, 42, 43.

On the other hand, in the case of a line to which signals should be written by the vertical shift register 71, for example, a line corresponding to the scanning line 21, pulses by which the TFTs of the pixel divisions are switched on are applied to the scanning line 21.

In consequence, the input video signals are written in turn to the pixel electrodes 511, 512, 513 via the signal lines 11, 12, 13. Therefore, in the case that the TFTs placed in the pixel divisions are the p-type, a voltage is applied from the power source terminal 33 so that a well potential may be more than a maximum of the amplitude of the video signals. Furthermore, in the case that the TFTs are the n-type, a voltage is applied from the source terminal 33 so that the well potential may be less than a minimum of the amplitude of the video signals.

Immediately when one H period (one horizontal scanning period) has elapsed, the potential of the scanning line 21 is regulated by the vertical shift register 71 to be at a level at which the TFTs in the pixel divisions are switched off. The same drive is carried out for the line of the next scanning line 22.

Figure 2:
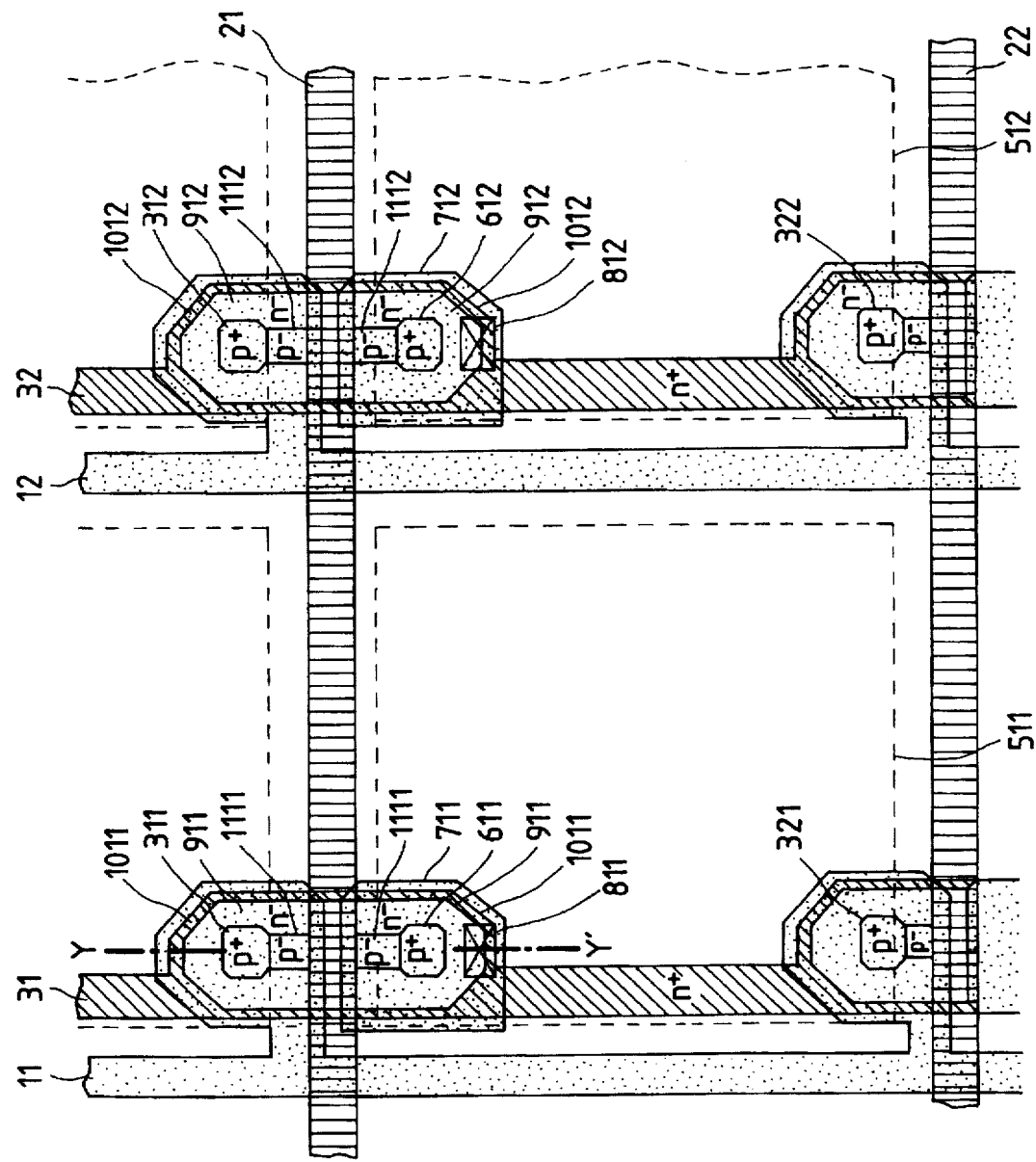
FIG. 2 is a schematic view illustrating one embodiment of an active matrix circuit board which can be applied to the liquid crystal display of the present invention.

FIG. 2 shows a plan view of an active matrix circuit board which can be applied to the liquid crystal display of the present invention.

In FIG. 2, the same parts as in the equivalent circuit shown in FIG. 1 are represented by the same reference numerals as in FIG. 1.

The signal line 11 is connected to the p⁺ layers 311, 321 of the source divisions of the TFTs via contacts. Similarly, the signal line 12 is connected to the p⁺ layers 312, 322 via contacts.

The signal lines 11, 12 are made up of a metal wire of Al, Al—Si, Al—Si—Cu or the like.

In this embodiment, the p⁺ layers 311, 611, 312, 612 are each arranged in the vicinity of the center of the source.drain division of the semiconductor layer constituting the TFT, and n⁺ layers 1011, 1012 having a high concentration are each arranged in its periphery. These highly concentrated layers are held sufficiently apart from each other in consideration of voltage resistance. In the case of this embodiment, a space of 1.5 to 2.5 µm is given between these layers.

In FIG. 2, the n wells are present between the p⁺ layers 311, 611, 312, 612 and the n⁺ layers 1011, 1012, and for the relief of an electric field between the n⁺ layer and the p⁺ layer, p⁻ layers may be formed in the peripheries of the p⁺ layers.

The signals fed to the signal lines 11, 12 are transmitted through the sources to the drains of the TFTs which can be operated via the scanning line 21. In FIG. 2, p⁻ layers 1111, 1112 are formed between the sources and gates, and between the drains and the gates in order to relieve the electric field between the sources and the gates and between the drains and the gates. Thus, even at a high voltage drive, for example, even at a level of 10 to 16 V, a sufficiently stable and reliable operation can be achieved. The scanning lines 21, 22 are usually made up of a poly-Si, but in order to obtain the high-speed drive and satisfactory shading on the scanning lines, it is desirable to use a polysilicide such as tungsten polysilicide, titanium polysilicide or molybdenum polysilicide.

On the drains, drain electrodes 711, 712 are arranged, and they are connected to the p⁺ layers 611, 612, respectively. The drain electrodes are made up of layers of the same wires as the signal lines, and the semiconductor divisions constituting the TFTs are covered with these wiring layers and the scanning lines, whereby the semiconductor divisions constituting the TFTs are shaded. A signal voltage is transmitted to the pixel electrodes 511, 512 via through-holes 811, 812.

This example is characterized in that, as shown in FIG. 2, the n⁺ layers 1011, 1012 having a high concentration d are arranged in the peripheries of the semiconductor divisions constituting the TFTs, and these n⁺ layers are also arranged along the signal lines to connect the n⁺ layers to a desired power source, thereby taking the well potential of the TFTs.

Figure 3:
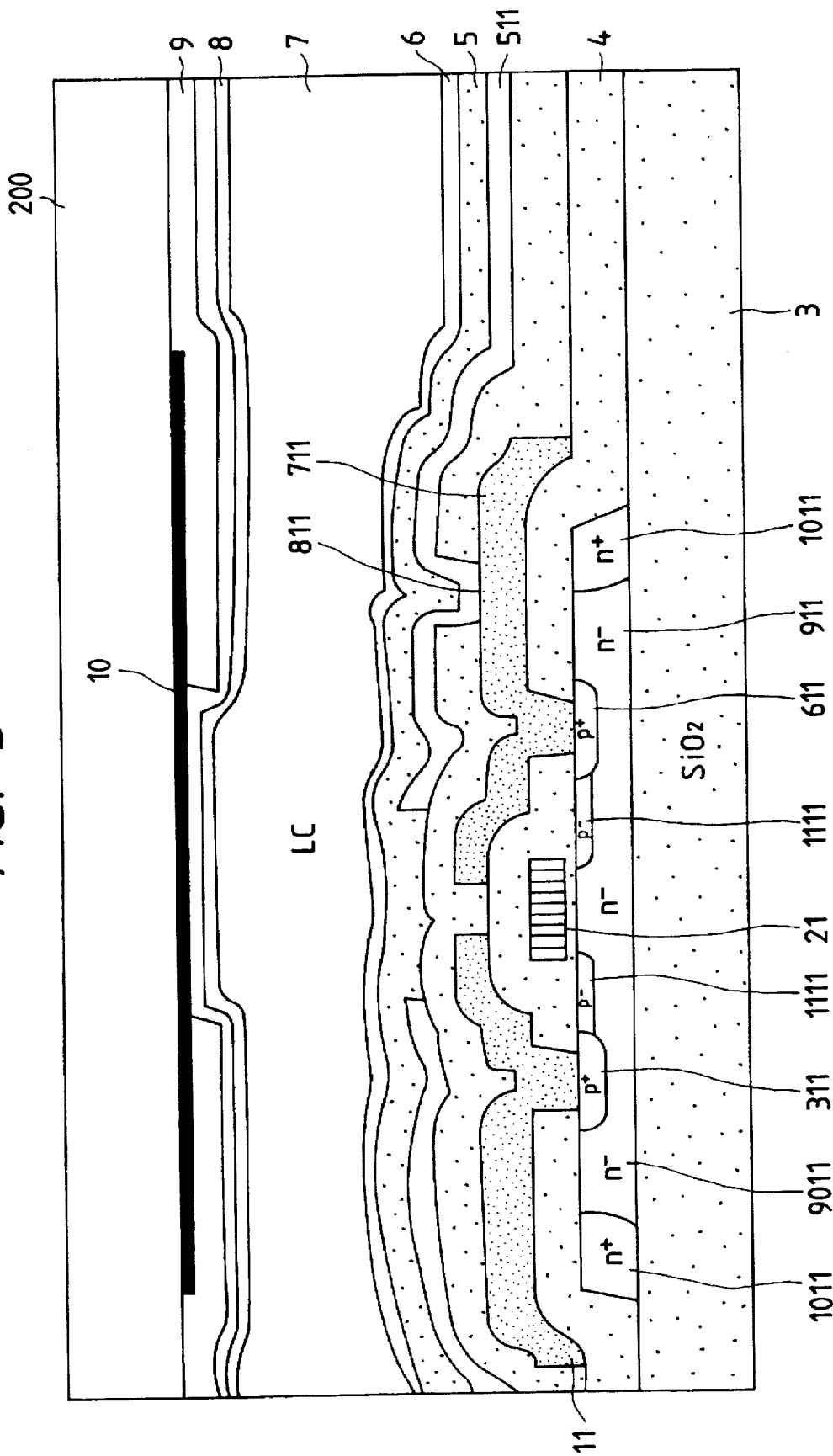
FIG. 3 is a schematic view illustrating one embodiment of a constitution of the liquid crystal display of the present invention.

A sectional view cut along the line Y-Y' in FIG. 2 is shown in FIG. 3. In FIG. 3, the semiconductor layer constituting the TFT is placed on a glass substrate 3, and in the periphery of the semiconductor division constituting the TFT of the semiconductor layer, the n⁺ layer 1011 is arranged.

Since the TFT having a p-type channel structure is used in the liquid crystal display shown in this drawing, the semiconductor layer comprises the n-type well, and since the semiconductor layer and the n⁺ layer 1011 have the same kind of conductive mode, there is no problem, even if the highly concentrated n⁺ layer 1011 is not always diffused to a boundary between the n⁺ layer 1011 and the glass substrate 4.

In the liquid crystal display of this embodiment, there is employed a structure in which no junction region is present in the periphery of the semiconductor layer, and thus any current is not generated from a defective layer which is formed in the case that the junction region is placed, so that the TFT in which a leakage current is inhibited can be obtained.

Next, the layer constitution of the liquid crystal display shown in FIG. 3 will be described.

After the source 311, the drain 611 and the like are formed on the semiconductor layer, the gate 21 which is used together with the scanning line and an interlayer insulating layer 4 are formed. The interlayer insulating layer can be made up of an SiN film formed by the use of a vacuum CVD method, PSG which is a phosphorus-doped glass, or a boron phosphorus-doped glass.

By the way, the warpage of the liquid crystal display panel is very important to uniformize a liquid crystal gap with the intention of obtaining a suitable display image. A laminate which can be used to constitute the liquid crystal display panel is prepared by superposing films having tensile stress or compressive stress upon each other. The films obtained by the above-mentioned vacuum CVD method have the strength tensile stress, and so the warpage of the liquid crystal display panel can be controlled by regulating the thickness of these films to a desired value. Numerals 11 and 711 are metal wiring layers, but in order to sufficiently heighten the adhesive state of the metal wiring layers, it is desirable to form BPSG under the metal wiring layers. The metal wiring layers are each preferably prepared by superposing a film of Ti, Ta, TiW, Mo, TiN, TaN or the like upon a wire of Al, Al—Si, Al—Si—Cu or the like. The thus prepared metal wiring layers are desirable, because the contact resistance of ITO or the like which becomes the pixel electrode is low, and ohmic properties and stability can be obtained.

After a wiring step, the insulating layer of PSG or the like is deposited to flatten an etch back and the like. After the through-hole 811 is formed, the pixel electrode 511 is formed by a sputtering process.

Prior to the film formation of a transparent electrode ITO (indium tin oxide) for the pixel electrode by the use of the sputtering process, the surface of the metal wire is preferably cleaned by presputtering. This cleaning operation realizes a good ohmic connection between the pixel electrode 511 and the metal wiring layer 711 which is the drain electrode.

After the patterning of the pixel electrode, a passivation film is formed, and a polyimide film is then applied thereonto as a liquid crystal orientation film. For the orientation, rubbing is used. The orientation film may comprise a one-layer structure or a multi-layer structure by which a view angle is enlarged.

On the other hand, a facing substrate is constituted by the following procedure. A layer 10 for shading a step portion of the TFT is formed on the glass substrate 200, while a space between the pixels is regulated, and color filter layers 9 are patterned so as to be separated by the pixels, as shown in FIG. 3, whereby a problem of color mixing between the color filters can be avoided.

On the color filter layer 9, a transparent electrode which is a common electrode and an orientation film 8 are formed to obtain the facing substrate. Between the thus obtained facing substrate and the active matrix circuit board, a liquid crystal 7 is confined to constitute the liquid crystal display panel. In FIG. 3, polarizing plates and the like are not shown, but the polarizing plates are arranged on the outer surfaces of both the substrates.

In this embodiment, a voltage is applied to a semiconductor layer region having the same conductive mode as in the well of the semiconductor constituting the TFT to fix a well potential. Then, on the side wall of the semiconductor region constituting the TFT, an impurity region having a conductive mode opposite to the source.drain is formed.

According to the above-mentioned constitution, the leakage current of the TFT can be reduced, so that the display having a high contrast and a high gradation can be realized. In addition, defects due to damage caused at the time of a manufacturing process can be decreased, and the liquid crystal display panel which exerts a stable operation can be obtained in a high yield.

EXAMPLE 2

An embodiment of a liquid crystal display shown in FIG. 4 will be described.

Figure 4:
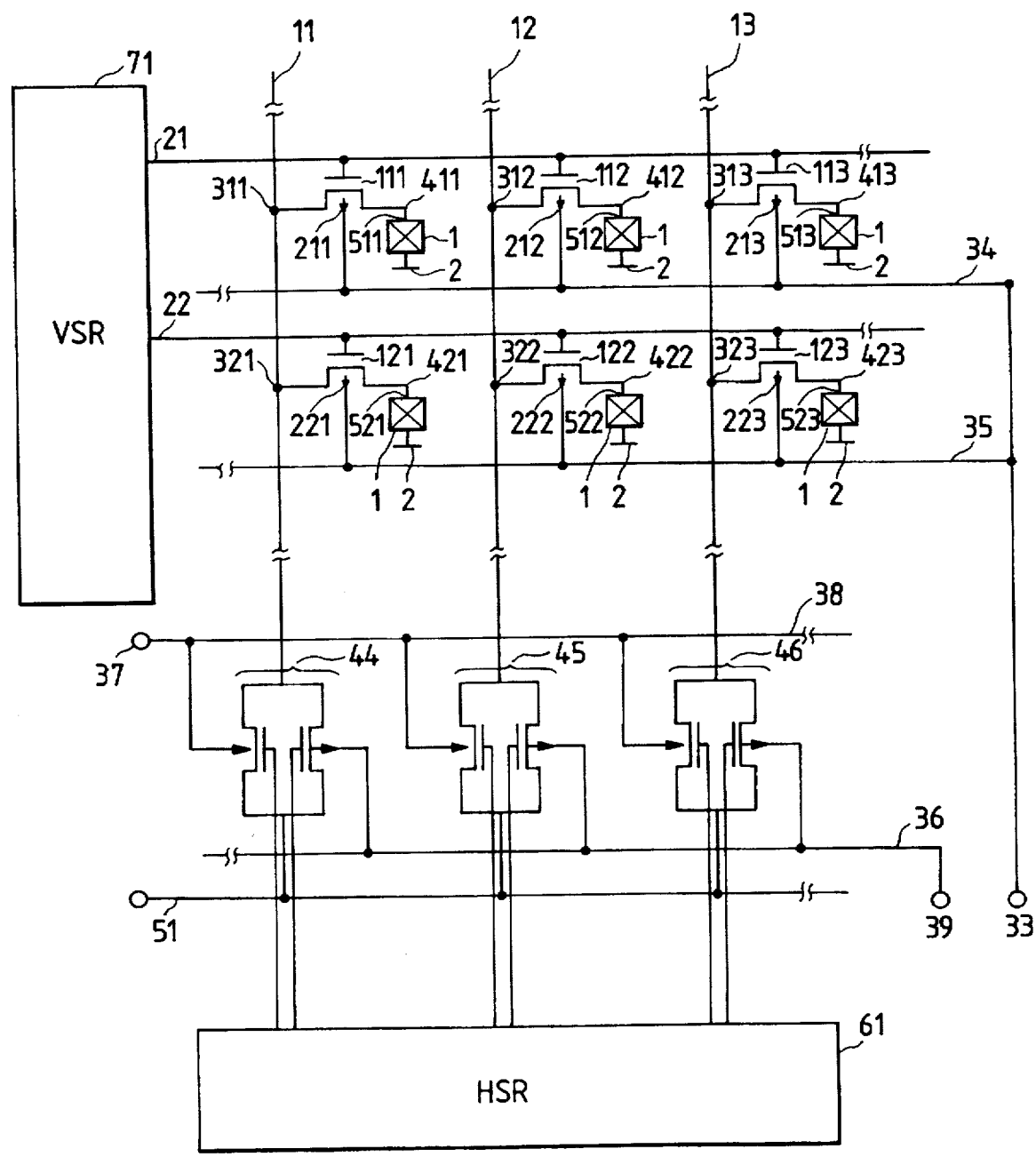
FIG. 4 is an equivalent circuit illustrating another embodiment of the liquid crystal display of the present invention.

FIG. 4 shows an equivalent circuit, and in FIG. 4, the same parts as in an equivalent circuit shown in FIG. 1 are represented by the same reference numerals and their detailed description will be omitted.

The liquid crystal display of this embodiment is different from a liquid crystal display of Example 1 in that wires 34, 35 for fixing a potential in a region (well) having a conductive mode different from that of a source.drain of a semiconductor layer constituting a TFT are arranged along scanning lines 21, 22, and a common connection is made in the periphery of a pixel panel, and video signals are sampled by the use of CMOS analog switches 44, 45 and 46.

In the case that the liquid crystal display panel is driven, it is effective for the inhibition of flicker that the voltage to be applied to the liquid crystal every line is reversed. In this case, a strong electric field takes place in a line direction extending between the pixel electrodes on each line, i.e., a longitudinal direction, so that a line defect called discrimination occurs, with the result that blank areas appear irrespective of the voltage to be applied to the pixel electrode and contrast deteriorates. Therefore, for the liquid crystal display capable of displaying an image with a high contrast, it is important that a space between pixel aperture regions in the longitudinal direction is set so as to be wider than in the transverse direction. According to this embodiment, the wires 34, 35 for fixing the well potential are arranged in a horizontal direction, so that the region where the blank areas tend to appear is effectively shaded, and the reverse drive is also possible. In consequence, the pixel display having the good contrast and the less flicker can be realized.

In the liquid crystal display of this embodiment, the sampling of the video signals is carried out by the use of the CMOS analog switches 44, 45 and 46, and the well potentials of the CMOS analog switches are also set to suitable values for the n-type and p-type TFTs, respectively. Reference numerals 36 and 38 are wires for fixing the well potentials, and numerals 37 and 39 are power sources for these wires.

Although not clearly shown in FIG. 4, well potentials of transistors used in peripheral circuits such as vertical and horizontal shift registers are also set to suitable values.

According to the above-mentioned constitution, the video signals can be sampled and fed to the signal lines independently of threshold values of the sampling transistors and the like, and therefore a panel drive voltage can be lowered to enhance reliability owing to the enlargement of a voltage resistance margin and to increase the freedom of the design of peripheral circuits. In addition, the freedom of connections to other ICs increases, and the decrease of cost can also be achieved.

EXAMPLE 3

An embodiment of a liquid crystal display shown in FIG. 5 will be described.

Figure 5:
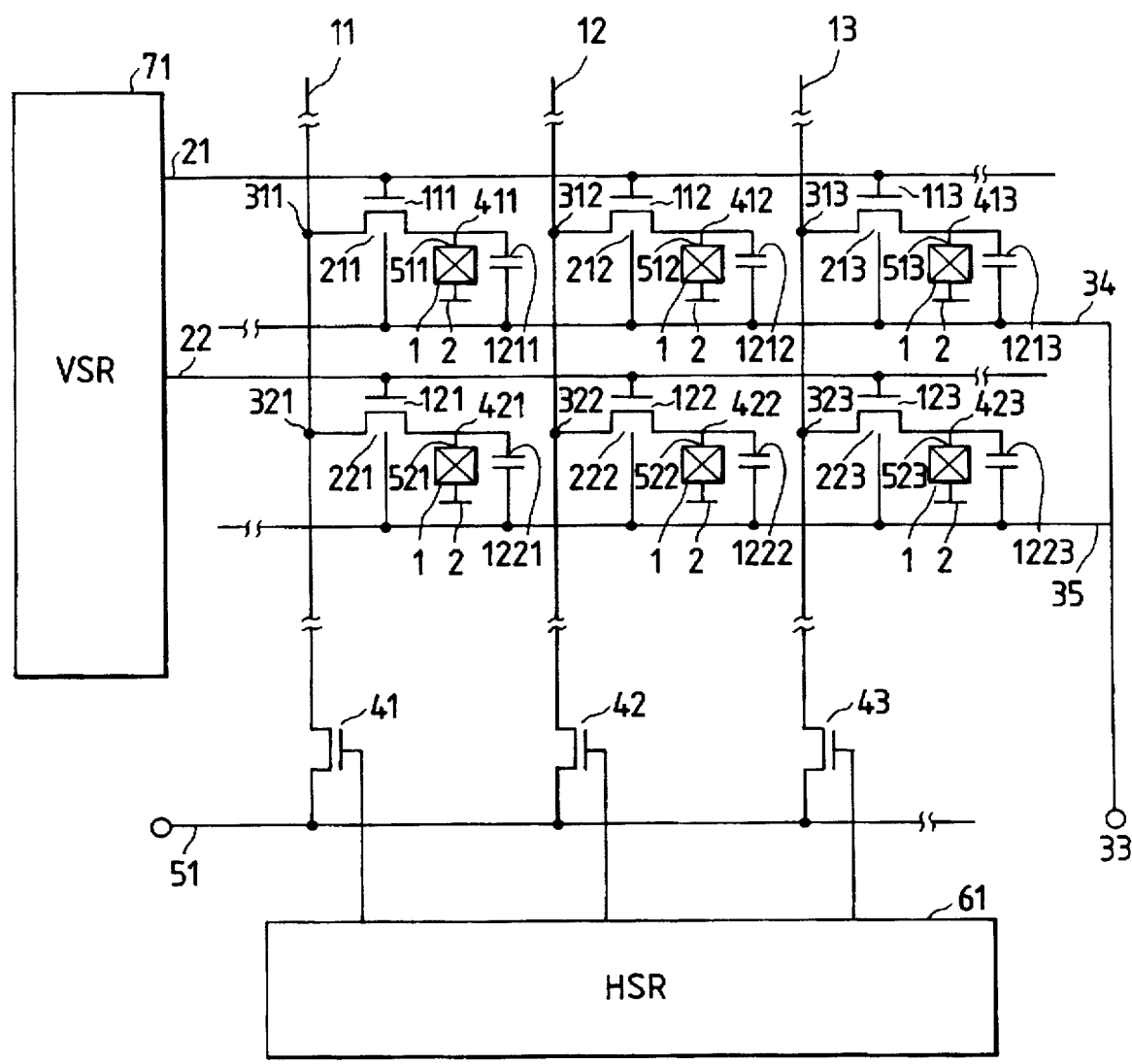
FIG. 5 is an equivalent circuit illustrating still another embodiment of the liquid crystal display of the present invention.

FIG. 5 shows an equivalent circuit, and in FIG. 5, the same parts as in an equivalent circuit shown in FIG. 1 are represented by the same reference numerals and their detailed description will be omitted.

This embodiment is characterized in that capacities 1211, 1212, 1213, 1221, 1222, 1223 for holding a voltage in each pixel are installed, and terminals of these capacities are connected to the drain electrodes of TFTs and the other terminals of these capacities are connected to electrodes 34, 35 having a well potential of the TFTs.

In general, the potential of the drain terminal of the TFT changes owing to the responsibility of the liquid crystal, deflection caused by on and off of the TFT and a leakage current of the TFT.

In particular, it is difficult to solve problems raised by these causes, and so an image quality often deteriorates. On the contrary, in the constitution of this embodiment, the sufficient capacities which are not affected by these causes are arranged in pixel divisions, whereby a good and stable image display can be realized.

The structure of the liquid crystal display of this embodiment will be described with reference to a plan view shown in FIG. 6. In the liquid crystal display panel shown in FIG. 6, signal lines 11, 12 are arranged, while shifted as much as a ½ pixel every line for the purpose of the improvement of resolution and coloring properties, and these signal lines are non-linear.

Source divisions 311, 312, drain divisions 611, 612 or gate divisions are arranged, being protruded from scanning lines 21, 22, and the arrangement direction of the source.drain extends along the scanning lines.

A signal voltage from the signal lines 11, 12 is transmitted to the sources 311, 312 of the TFTs, respectively, and when the voltage by which the TFT is switched on is applied to the scanning line 21, it is forwarded to the drain divisions 611, 612. FIG. 7 shows a detailed view of a periphery of a region surrounded by a dotted line A. Description will be made with reference to FIG. 7 in addition to FIG. 6.

In the periphery of the source division.drain division of the TFT, a highly concentrated impurity layer 1301 having the same conductive mode as in a well is formed in upward, downward, right and left directions except a part of a lower portion in which an opening 1800 of a panel, the source division, the drain division, the scanning line and the signal line are arranged.

Figure 6:
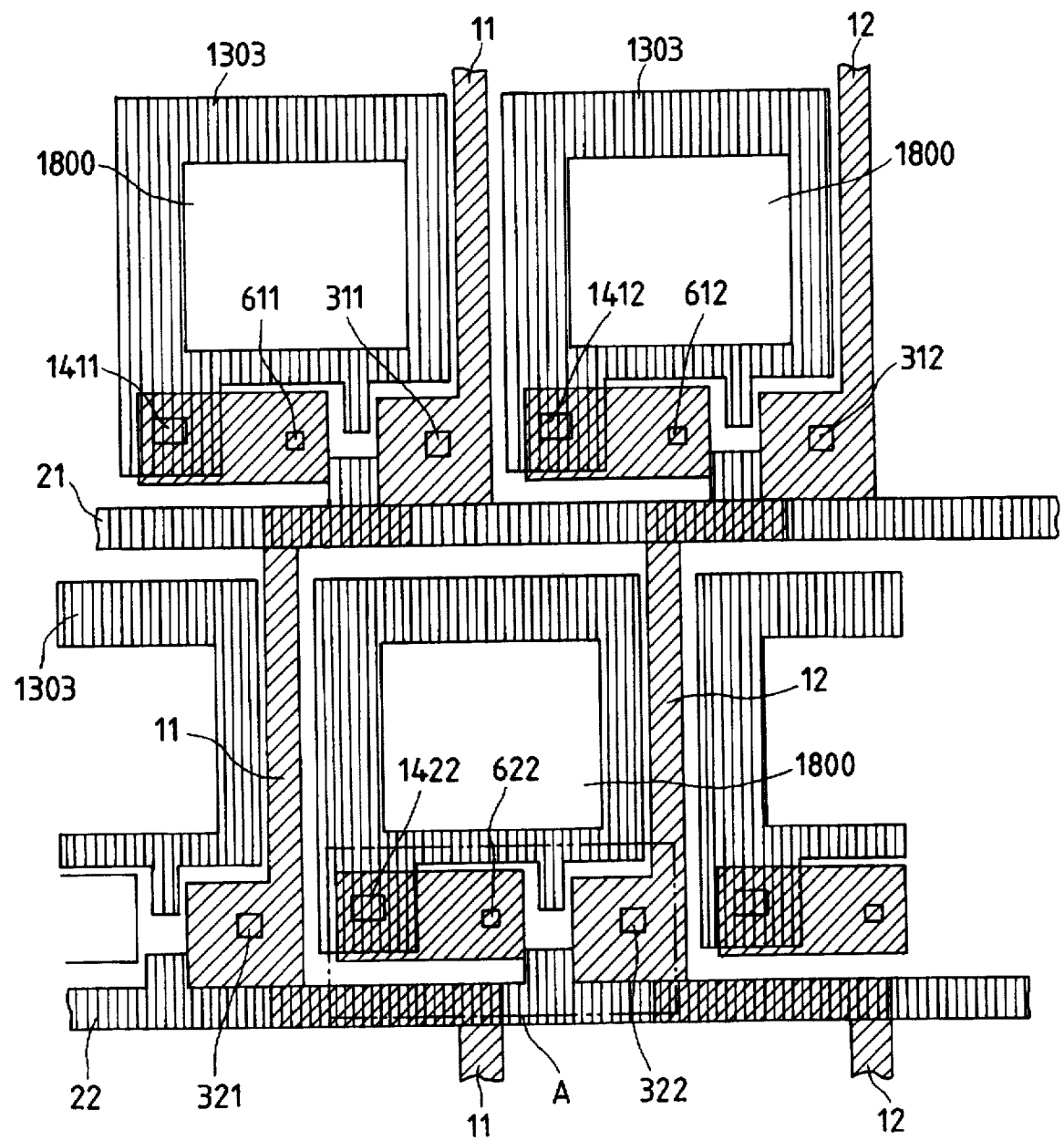
FIG. 6 is a schematic view illustrating another embodiment of the active matrix circuit board which can be applied to the liquid crystal display of the present invention.
Figure 7:
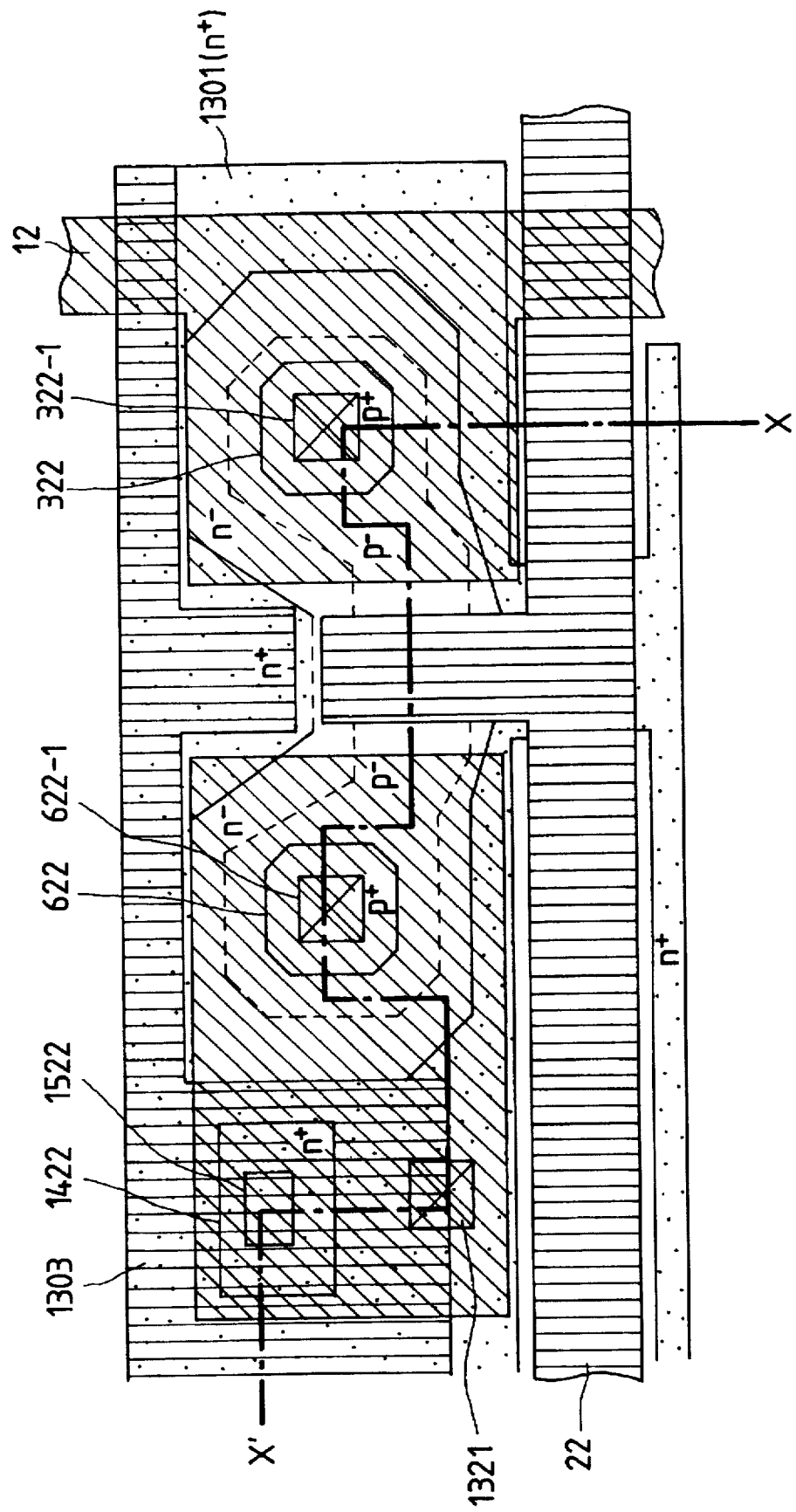
FIG. 7 is an enlarged view in which a region A in FIG. 6 is enlarged.

As shown by numeral 1303 in FIG. 6, the potential contacts a wiring layer in the periphery of the panel opening 1800, so that it is fixed. On the highly concentrated impurity layer 1301, a capacitance forming member 1303 is formed via an insulating layer. The capacitance forming member 1303 is made up of a poly-Si polysilicide, a high-melting metal or the like. This capacitance forming member 1303 is used to form the capacitance between the capacity forming member 1303 and the highly concentrated impurity layer 1301.

The signal forwarded to the drain division is fed to the capacitance forming member 1303 at a contact division via the wire.

Thus, one terminal of the capacitance forming member 1303 is connected to the drain division of the TFT, and the other terminal of the capacitance forming member 1303 is connected to the well division of the TFT.

Although not shown in FIGS. 6 and 7, a shading layer is formed on the front side of this paper except the portion of the opening 1800. The shading layer can be made up of an insulating layer or a conductive layer. In this embodiment, a TaN film is used. In this case, the TaN film is a conductive layer, and therefore if the TaN film contacts the drain or the pixel electrode, the signal is not transmitted to the pixel electrode. Accordingly, a hole 1422 is formed around a through-hole 1522 for connecting the pixel electrode to the drain division.

According to the above-mentioned structure, the pixel electrode potential is more stable, and a high-quality image display can be realized.

Next, a preparation method of the active matrix circuit board used in the embodiment will be described with reference to FIGS. 8A to 8J and 9A to 9E. FIGS. 8A to 8J describe a serial of preparation steps, and FIGS. 9A to 9E describe one embodiment of a process for forming a semiconductor layer on an insulating substrate.

Figure 8A:
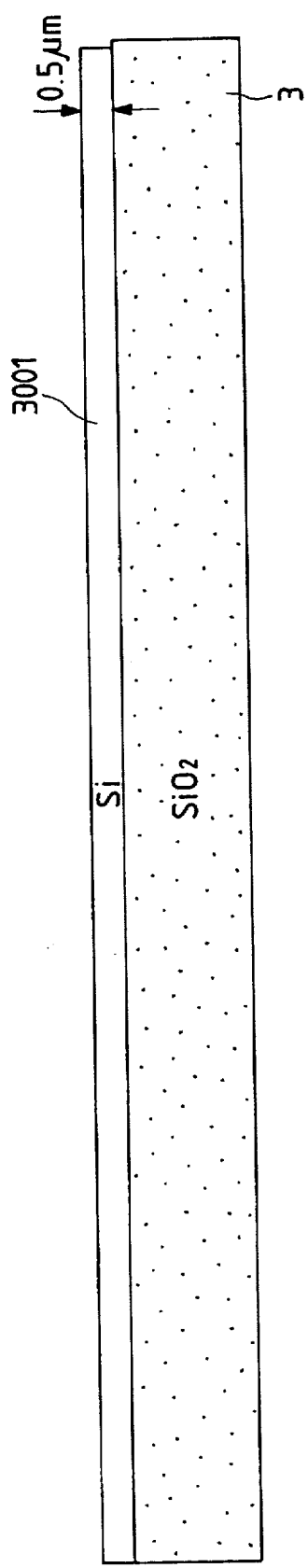
FIGS. 8A to 8J are schematic views illustrating one embodiment of a manufacturing process of the liquid crystal display of the present invention.

As shown in FIG. 8A, a semiconductor Si layer 3001 was formed on a glass substrate 3.

The semiconductor layer may be made of a substance such as GaAs in the group III to V, or a substance in the Group II to VI, in addition to Si. In the case of a poly-Si, its thickness is preferably as thin as 100 to 700 Å. An amorphous Si is deposited from an $Si_2H_6$ material gas by a vacuum CVD method at 450° C., and a heat treatment is then carried out at 600° C. for 24 hours in $N_2$, whereby solid phase crystallization is done. Furthermore, the heat treatment is carried out at 1050° C. in $O_2$ to improve crystallinity.

Alternatively, the poly-Si film may be formed from an $SiH_4$ material gas at a temperature of 500° to 600° C., and the ion injection of Si may be then done to bring the poly-Si film into a state close to an amorphous state. Afterward, the film may be subjected to a heat treatment at 500° to 700° C. for 50 hours.

In the case of a single crystal, its thickness is preferably as thick as 1000 to 8000 Å, but this value is not restrictive. The single crystal was formed as follows. In the first place, an oxidized Si wafer or an Si wafer was integrally stuck on a quartz glass wafer in a clean atmosphere. Afterward, it was subjected to an anneal treatment at a temperature of 150° to 200° C. and then ground by a grinder so that the thickness of an Si layer might be 100 to 200 μm. Next, the anneal temperature was raised up to 300° C., and etching was then carried out with a TMAH (tetramethylammonium hydroxide) etching solution so that the thickness of the Si layer might be about 0.5 μm. After thus thinned by the etching, the Si layer was subjected to the anneal treatment at 1000° C. again to heighten boarding strength. In the case of such a process, the internal uniformity of the Si thin layer depends largely upon the precision of the grinder inconveniently.

For the avoidance of this inconvenience, a technique shown in FIGS. 9A to 9E can be utilized. This technique will be described with reference to FIGS. 9A to 9E.

Figure 9A:
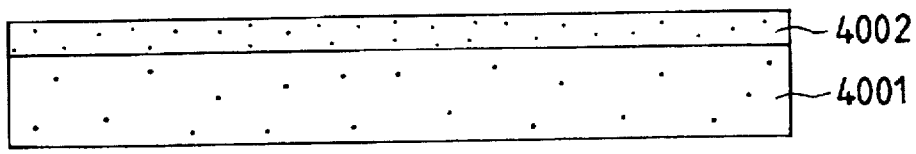
FIGS. 9A to 9E are schematic views illustrating another embodiment of a manufacturing process of the liquid crystal display of the present invention.
Figure 9B:
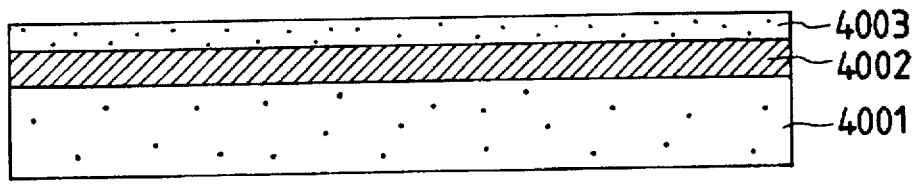
Figure 9C:
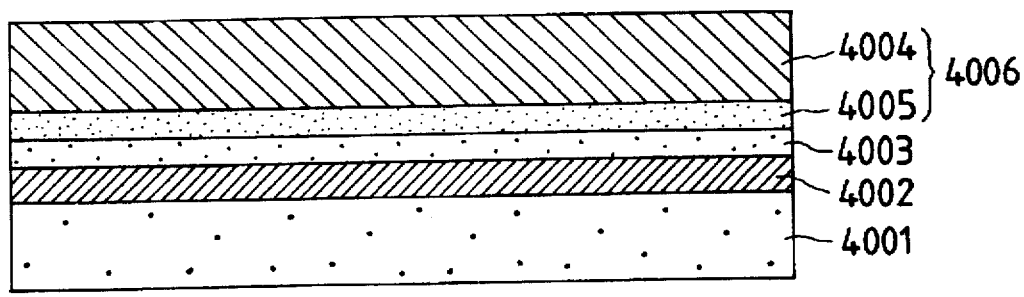
Figure 9D:
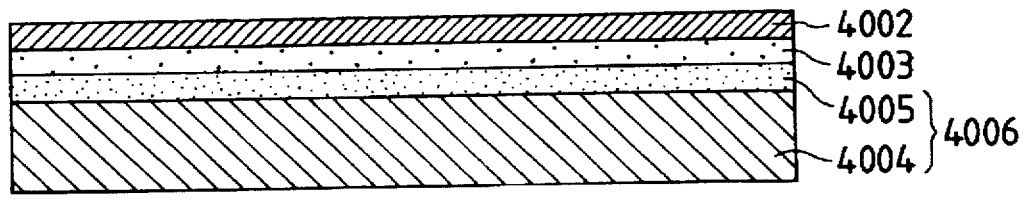

A current of about 1A is allowed to flow through a hydrofluoric acid-ethanol mixed solution in which an Si wafer 4001 is immersed, thereby forming a porous layer 4002 having a thickness of about 15 μm on the surface of the Si wafer 4001 (FIG. 9A). Afterward, the porous layer is washed and then oxidized at 400° C. for 20 minutes in an oxygen atmosphere, and the resultant surface oxide layer is removed in a diluted hydrofluoric acid solution. The treated wafer thus obtained is placed in a vacuum CVD device, and a heat treatment is then carried out at 1100° C. for 7 minutes in an $H_2$ atmosphere. Afterward, an epitaxial Si film 4003 having a thickness of 0.5 to 1 μm is allowed to grow at 900° C. on the porous Si layer 4002 (FIG. 9B). Even on the porous layer, the high-quality epitaxial film can grow, if the diluted hydrofluoric acid and the $H_2$ anneal treatment are given. As in the above-mentioned example, this wafer is bonded to a quartz glass 4006 (FIG. 9C), and the annealing and the etching of the non-porous layer 4001 are repeated. In this case, the quartz glass 4006 to be bonded may be replaced with an Si wafer 4004 on which an oxide film 4005 is formed. For the removal of the non-porous layer 4001 of Si, grinding or polishing may be used instead of the etching.

Figure 9E:
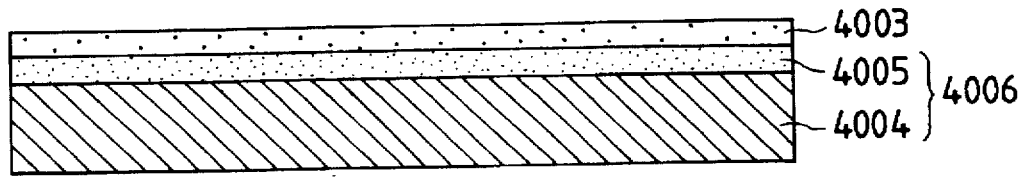

When the thickness of the non-porous layer 4001 of Si becomes about 150 μm, the remaining Si layer is removed with a hydrofluoronitic acetic acid solution. At this time, the porous Si layer 4002 is exposed, with the result that its surface blackens, whereby it is apparent that the etching progresses to such a level that the porous Si layer 4002 is reached. Instead of this process, the polishing grinder may be used to expose the porous layer. After the porous layer 4002 has been exposed, the porous layer 4002 is removed by etching in a hydrofluoric hydrogen peroxide solution (FIG. 9D), whereby the single crystal Si layer 4003 having a uniform thickness can be formed on the glass substrate 4006 (FIG. 9E).

As described above, the glass substrate 4006 may be replaced with a laminate substrate obtained by forming the oxide film 4005 on the Si wafer 4004. In this case, if the Si wafer 4004 is partially etched to become light-transmittable, the thus etched Si wafer can be applied to the liquid crystal panel. Also by the above-mentioned procedure, the semiconductor thin film 3001 can be formed on the insulating substrate 3 (FIG. 8A).

Figure 8B:
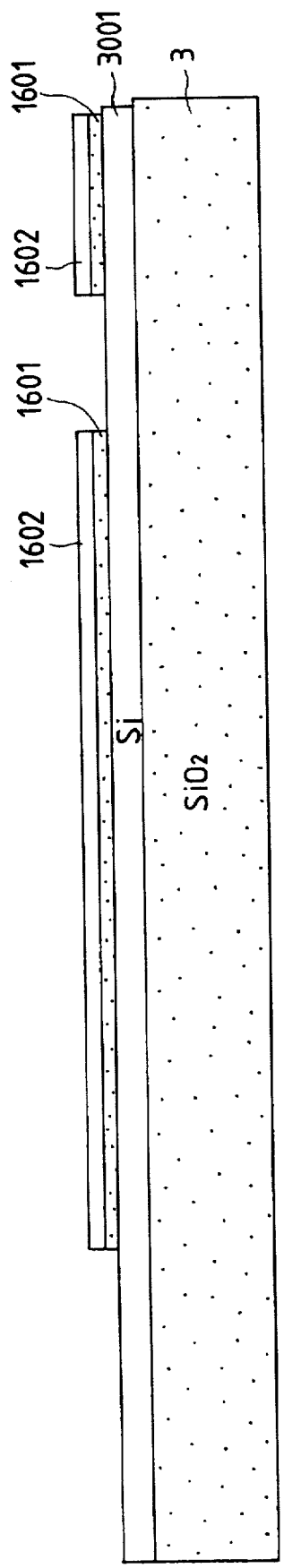
Figure 8C:
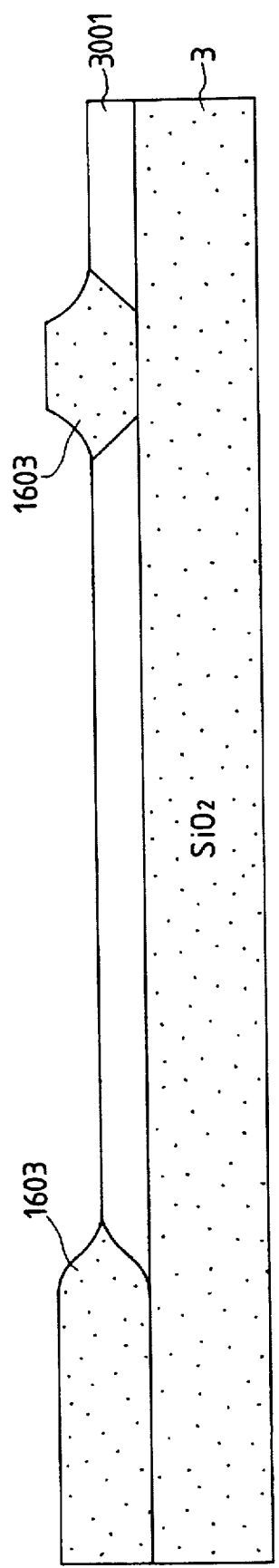

Next, as shown in FIG. 8B, an oxide film 1601 and an SiN film 1602 were formed except the partial regions of an opening region and a wiring region, followed by a heat treatment, whereby as shown in FIG. 8C, the region of the Si layer in which the oxide film 1601 and the SiN film 1602 were not formed was oxidized to form a field oxide film 1603.

Figure 8D:
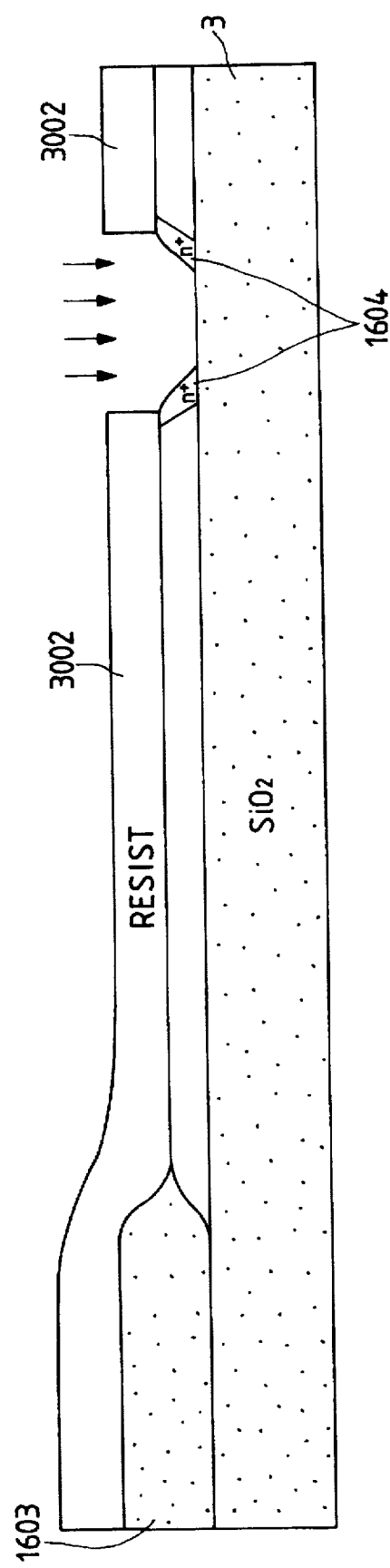

As shown in FIG. 8D, a resist mask 3002 was placed, and the field oxide film 1603 which was a part of the wiring region was removed. After the removal, ions of arsenic or phosphorus were injected through this resist mask 3002 to form an n$^+$layer on an Si thin film edge 1604. This step is not always necessary, and so if a low cost is required, the step may be omitted.

Figure 8E:
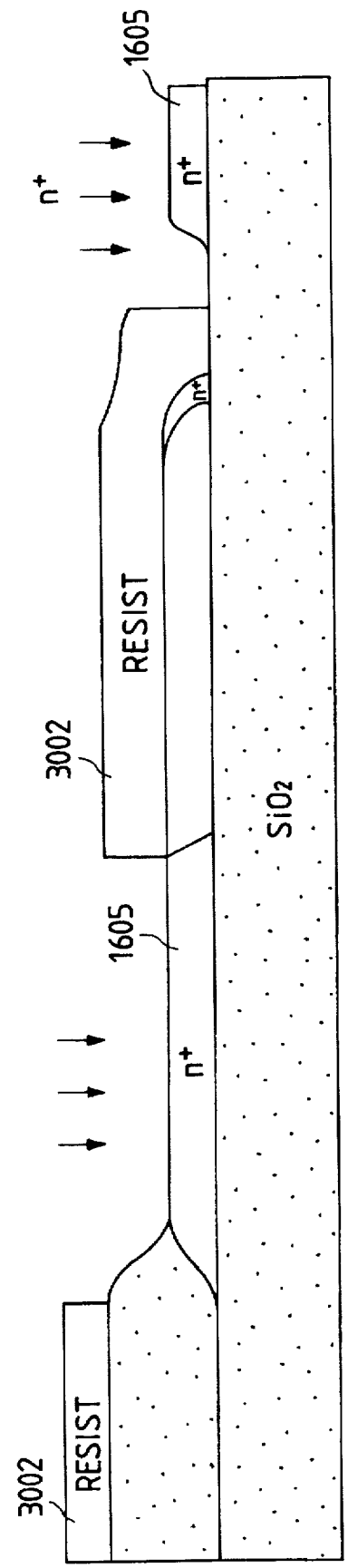
Figure 8F:
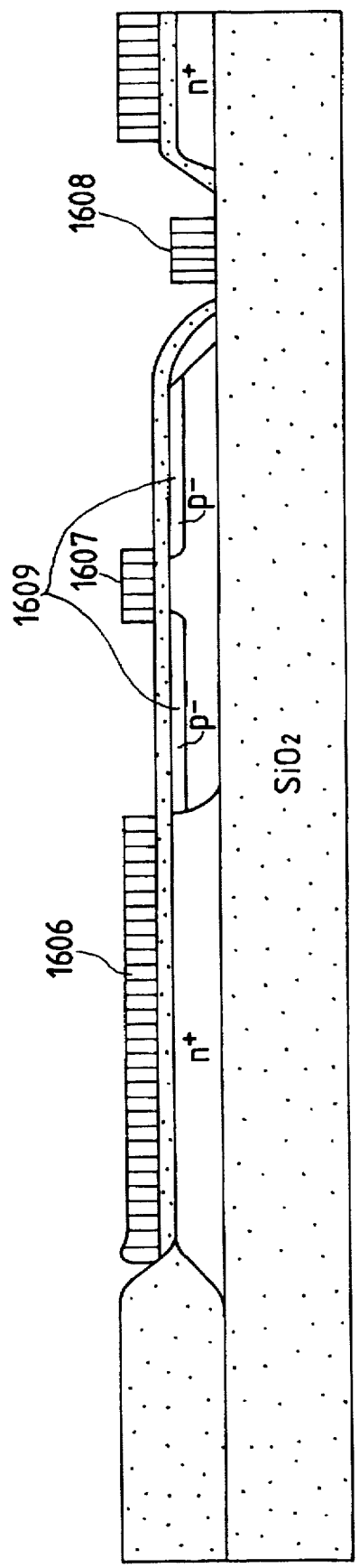

Next, as shown in FIG. 8E, a highly concentrated impurity layer 1605 for fixing the well potential of the TFT was formed. In order to lower the resistance of the highly concentrated layer and to shorten, to the utmost, the diffusion length of a light carrier due to leakage light, it is desirable that the highly concentrated impurity layer 1605 reaches an insulating layer and the concentration is $10^{19}$ cm$^{-3}$ or more. Next, as a member for forming the scanning line, the gate line and the capacitor of the TFT, a poly-Si film was deposited after the formation of a gate oxide film, followed by patterning (FIG. 9F). Numeral 1606 is a capacitance member forming (corresponding to 1303 shown in FIG. 6), 1607 is a gate of the TFT, and 1608 is a poly-Si for a scanning line region.

As shown, if possible, the scanning line 1608 should not be formed on the Si semiconductor layer to lower a parasitic capacitance. The scanning line is arranged between the semiconductor layers, and therefore a step also decreases, so that an orientation failure reduces. Next, the above-mentioned poly-Si was used as a mask, and p$^-$ layers 1609 were formed between the gate and the drain and between the gate and the source so as to relieve an electric field.

Figure 8G:
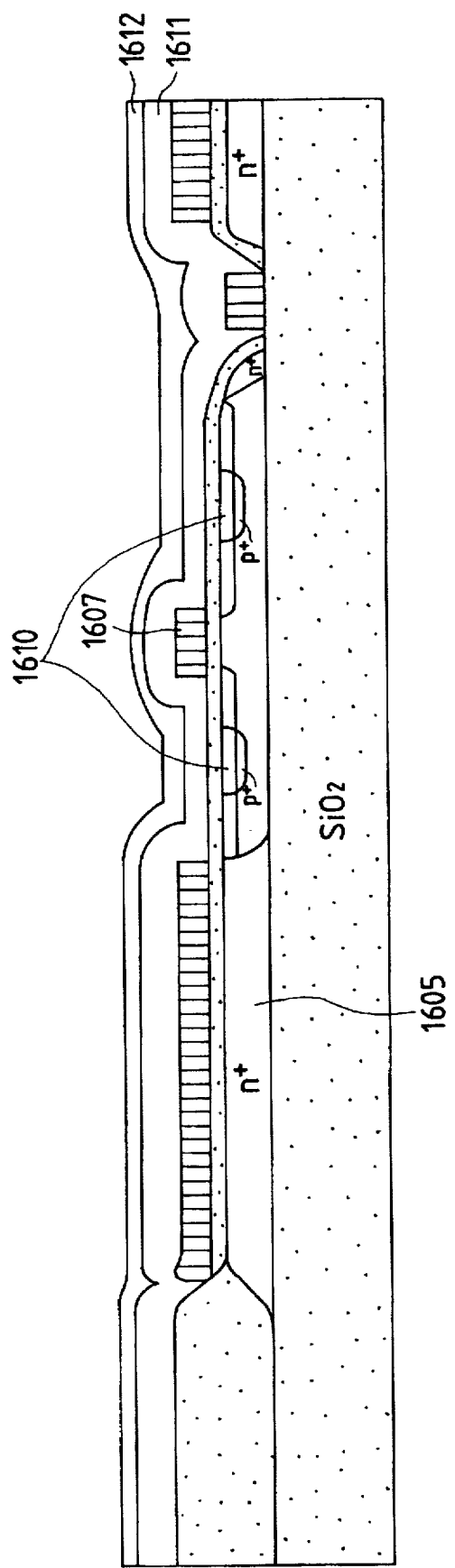

As shown in FIG. 8G, p⁺ layers 1610 which became the source and the drain were formed, and in this case, these layers were offset as much as 1 to 1.5 μm to the gate 1607, and a distance from the n⁺ layer 1605 was set to 1.5 to 2.5 μm. In consequence, a voltage resistance of 30 V or more could be realized which was sufficient for liquid crystal drive. After the annealing of the p⁺ layers 1610 of the source.drain, an SiN film 1611 having a thickness of 4500 Å and a BPSG 1612 having a thickness of 2000 Å were formed by the use of a vacuum CVD method. According to the SiN film, tensile stress can be obtained, and this film is effective to regulate the warpage of the laminate film. The control of the warpage is important to uniformize a liquid crystal gap. The BPSG has an advantage that metal wiring thereon can be formed with a good adhesion.

Figure 8H:
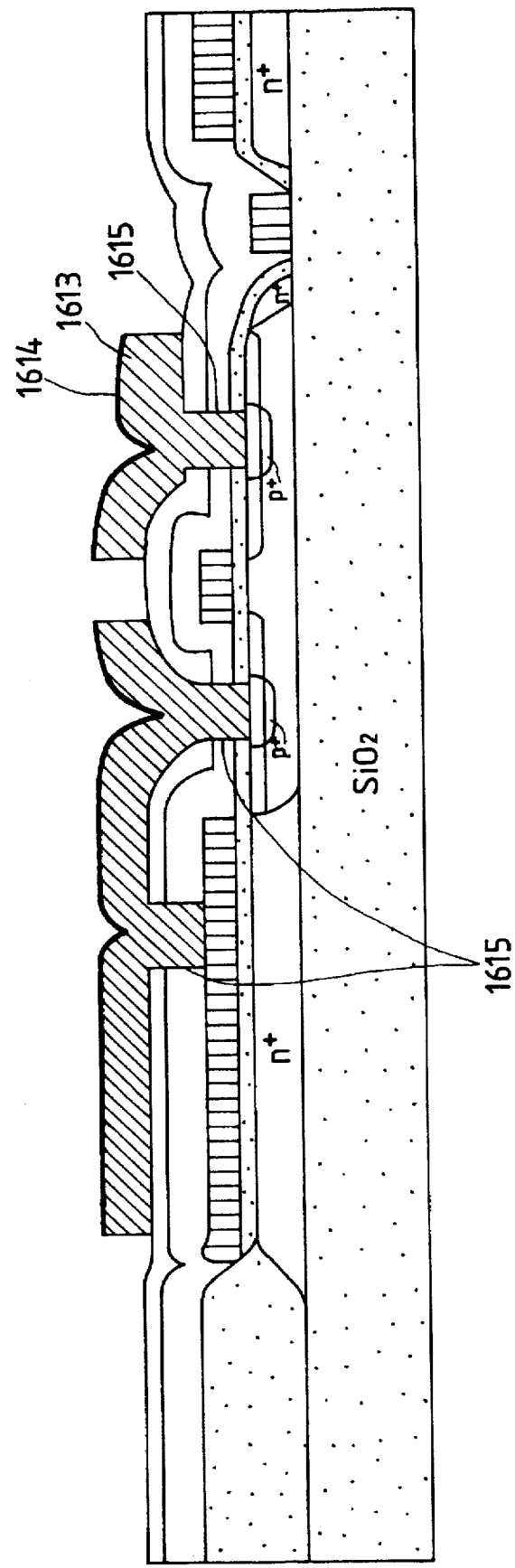

Contact holes were formed at positions represented by reference numeral 1615 of the interlayer insulating layer comprising the SiN film 1611 and the BPSG 1612, and a wiring layer 1613 was deposited. The wiring layer 1613 was made from, for example, Al—Si, Al—Si—Cu or the like, and on the wiring layer 1613, a layer 1614 was formed and in this case, as materials for the layer 1614, there can be used TiN, TaN, Mo, TiW, Ti, Ta and the like (FIG. 8H). This constitution can improve contact properties with a transparent electrode, is effective for the prevention of hillock to the upper layers and the improvement of shading, and can improve a yield.

Figure 8I:
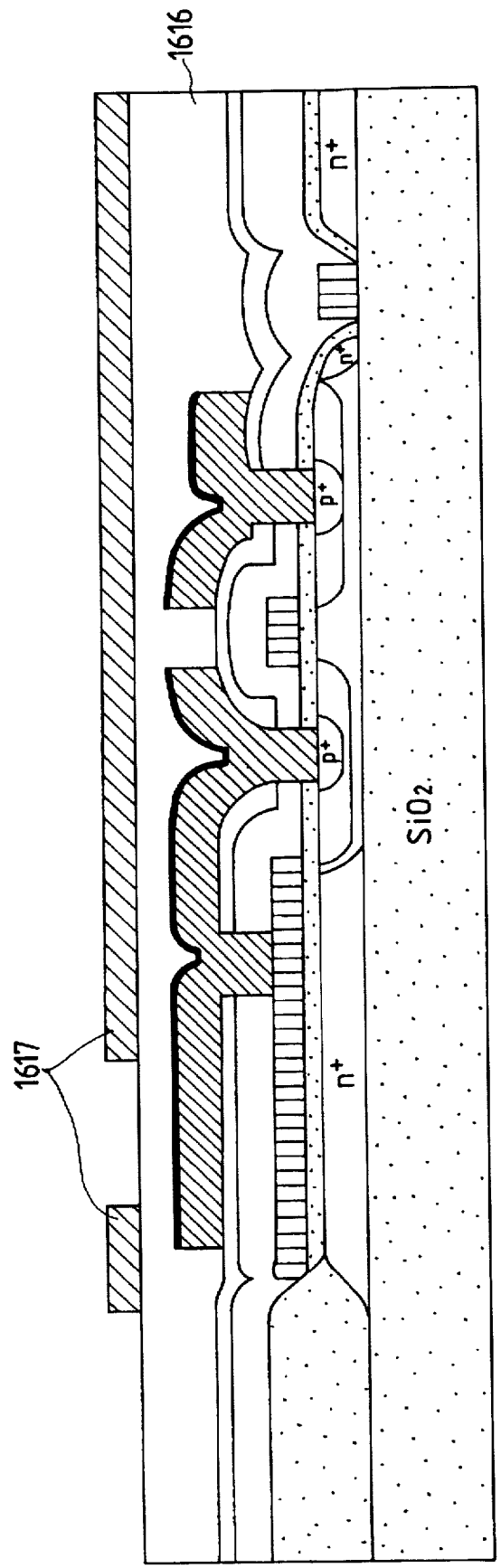

As shown in FIG. 8I, after the deposition of a PSG and the application of a resist, the insulating layer on the wiring was flattened by etching back, and the PSG was then deposited thereon again to form an insulating layer 1616 having a total thickness of about 10000 to 13000 Å.

In general, in the liquid crystal display panel, the shading is carried out by forming a shading layer on the facing substrate, but in this case, an aperture 10 ratio decreases in view of a position deviation from the active matrix circuit board on which the TFTs are placed. Here, a shading layer represented by reference numeral 1617 was formed on the active matrix circuit board on which the TFTs are placed. In consequence, the shading layer can be formed with an alignment precision of a usual semiconductor process. For example, even in the panel having a level of 3,000,000 pixels in 0.7 inch, an aperture ratio of 30% can be obtained. As understood from the position of the shading layer 1617 in FIG. 8I, a region which contacts the pixel electrode is open.

Figure 8J:
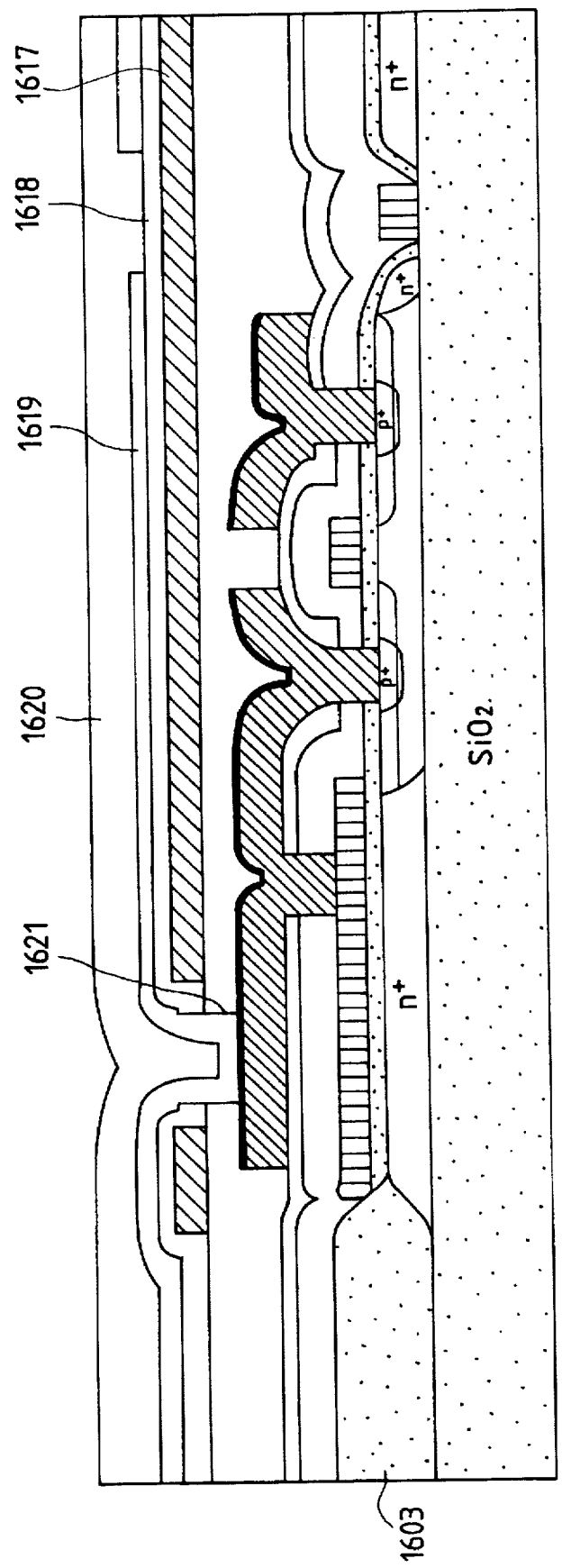

Next, as shown in FIG. 8J, after a PSG 1618 having a thickness of 1000 to 2000 Å was deposited, a through-hole 1522 through which the pixel electrode contacts the drain division is formed by etching, and a transparent electrode ITO 1619 for the pixel electrode was deposited. In order to obtain a good ohmic contact, it is important to remove the insulating layer formed on the wiring by presputtering the through-hole division, prior to this deposition.

After the patterning of the transparent electrode 1619, a PSG film 1620 having a thickness of about 8000 Å was deposited as a passivation film. Here, if a step is present at the edge portion of the opening region, a blank area is formed, and therefore it is desirable to flatten this PSG. Furthermore, if a passivation film on the pixel electrode alone is removed, baking properties are improved, thereby providing a stable displaying. And, connections of an electrode pad and a light shielding layer to the power source are formed at a periphery of the panel. The connection is not shown in the drawings. In this connection, the sectional shown in FIG. 8J corresponds to the section of the substrate cut along the line X-X' shown in FIG. 7.

Afterward, although not shown, a polyimide film having a thickness of about 500 Å is formed, followed by a rubbing treatment was carried out to do an orientation treatment. In this case, for the improvement of the view angle of the liquid crystal, it is also effective to form a plurality of orientation films and a plurality regions having different pretilt angles.

In the liquid crystal display of this embodiment using the active matrix circuit board described above, the leakage current of the TFTs could be further reduced, and the stability of the pixel potential could also be improved, whereby a good image display could be realized. In addition, as understood from FIGS. 8I and 8J, the field oxide film 1603 in the opening region was thick, and a flat constitution was realized. In consequence, any blank area was not present, and a high contrast and a high aperture ratio could be realized.

EXAMPLE 4

Figure 10:
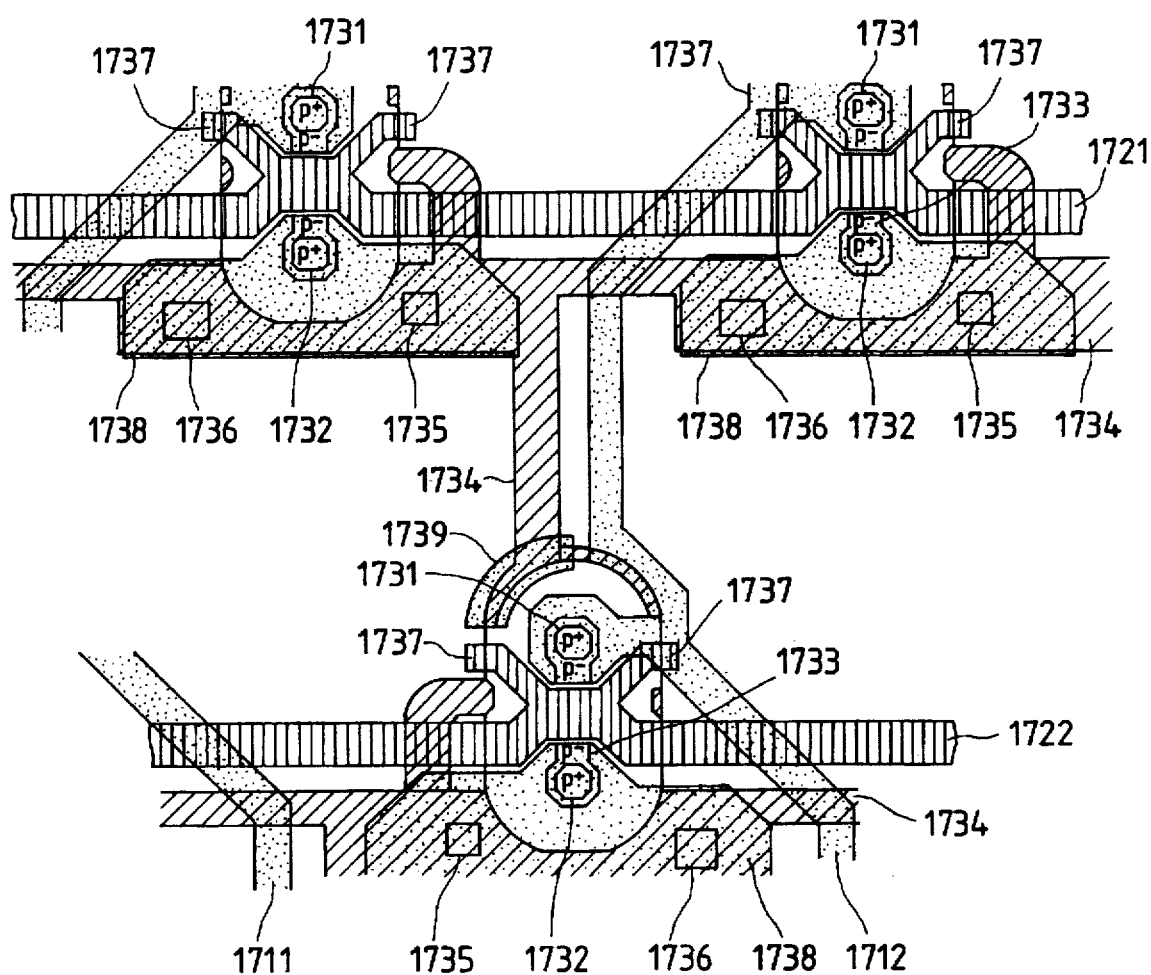
FIG. 10 is a schematic view illustrating still another embodiment of the active matrix circuit board which can be applied to the liquid crystal display of the present invention.

Description will be made with reference to FIG. 10. FIG. 10 shows a plan view of an active matrix circuit board used in a liquid crystal display panel of this embodiment. In FIG. 10, reference numerals 1721, 1722 are scanning lines of lines, numerals 1711, 1712 are signal lines, 1731 is a p³⁰ layer of a source division for connecting the signal line to a TFT. 1732 is a p⁺ layer of a drain division of the TFT. Reference numeral 1733 is a p⁻ layer formed to relieve an electric field of the source and a gate as well as the drain and the gate, and to relieve an electric field of the source and a well as well as the drain and the well. Numeral 1734 is a highly concentrated layer having the same conductive mode as in the well, and in this embodiment, it is a n⁺ layer. Numeral 1735 is a contact hole for connecting the drain to a poly-Si (not shown) on the n⁺ layer, and 1736 is a through-hole for connecting the drain to a pixel electrode (not shown). As shown by numeral 1737, the gate of the TFT which can be used in this embodiment is divided into two on the side wall portion of the semiconductor layer, and the highly concentrated layer 1734 is placed between them. As described above, the main position of the current leakage in the TFT is the side wall portion. According to the above-mentioned structure, the gate of the side wall portion is doubled so as to have a redundancy, and even if the leakage occurs by a defect or the like at one gate, the leakage can be prevented by the other gate.

Heretofore, the constitution simply comprising two gates as the redundant gate has been used, but if such a constitution is taken, a channel division of the TFT becomes a series connection, and its resistance increases twice as compared with the case of one gate.

Therefore, the writing of the signal is correspondingly slow, and the size of the TFT also increases and there is a drawback that a practical aperture ratio is low. If the constitution of this embodiment is used, the leakage current is prevented more effectively than in the case that the double gate is used, and the channel resistance of the TFT is low as in the case of the single gate. Thus, the writing speed is high, and the TFT leakage is also low. In consequence, a high-quality image display can be realized, and the aperture ratio is high and a clear display is possible.

As also understood from FIG. 10, the highly concentrated impurity layer n⁺ represented by the numeral 1734 and the gate 1737 are arranged suitably apart from each other, and voltage resistance of the channel produced at the time of ON of the gate and the above-mentioned n⁺ layer can be set at a sufficiently high level, whereby a high reliability could be obtained.

Furthermore, as shown by numerals 1738, 1739 in FIG. 10, a metal layer is formed as a wiring layer or a shading layer with an edge over size of the semiconductor layer. According to the present structure, the shading metal is also arranged on the side wall portion of the semiconductor, so that there can be exerted an effect that the deterioration of contrast does not occur by light leakage.

EXAMPLE 5

Description will be made with reference to FIGS. 11A, 11B and 11C.

Figure 11A:
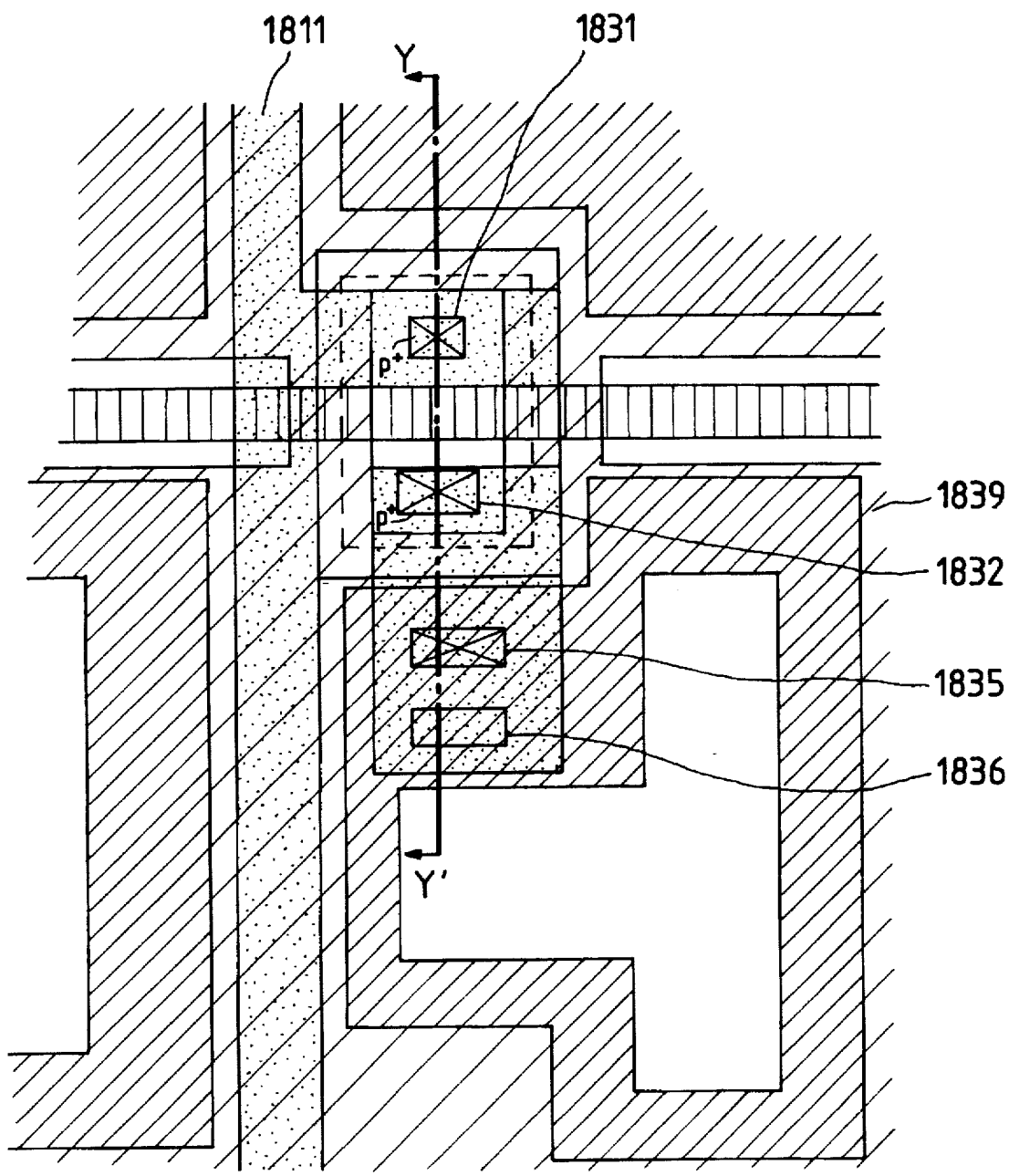
FIGS. 11A is a schematic view illustrating a further embodiment of the active matrix circuit board which can be applied to the liquid crystal display of the present invention.

FIG. 11A is a plan view of an active matrix circuit board used in a liquid crystal display panel of this embodiment, FIG. 11B is a sectional view cut along the line Y-Y' in FIG. 11A, and FIG. 11C is a sectional view of its variant. Reference numeral 1811 is a signal line, numeral 1831 is a $p^+$ layer constituting a source division, 1832 is a $p^+$ layer constituting a drain division, 1835 is a contact division to a poly-Si 1838 forming a capacitor, and 1836 is a through-hole for connecting the drain division to a pixel electrode 1839.

In the above-mentioned example, a well potential is drawn from a semiconductor layer on which the drain, the source and the well of a TFT are formed, and then fixed, but in this embodiment, a poly-Si layer 1837 which is different from the semiconductor on which a transistor is formed is used as a wire for fixing the well potential, and this point is different from the above-mentioned example. In this structure, a highly concentrated impurity layer 1840 is formed in a self alignment with a direct contact 1841 by diffusion from the poly-Si layer 1837. Therefore, the semiconductor layer area of the TFT can be reduced, and a liquid crystal display which could prevent light leakage could be realized. Moreover, as understood from FIG. 11B, in this structure, as shown by numerals 1837, 1838, the two poly-Si layers are formed, and the capacity is formed between these two poly-Si layers. The poly-Si layers for setting this well potential are not constituted of the poly-Si singly, and they may comprise a mixture of a metal and Si such as a polysilicide layer.

As shown in FIG. 11C, in the poly-Si 1838 of the second layer, a drain division 1842 is also formed by direct contact, and contact with the pixel electrode is also directly carried out on the poly-Si 1838 without using an Al sire. In this case, on the poly-Si surface, a Ti layer is formed, and Ti silicide or the like is formed by a heat treatment, so that a good ohmic contact can be realized.

According to the above-mentioned constitution, a space between the drain division and the pixel electrode contact can be decreased, and the clear panel having a high aperture ratio can be realized. In FIG. 11C, the contact and the through-hole of numerals 1842 and 1843 are formed in different positions, but if they are arranged in a longitudinal direction, a farther high aperture ratio can be achieved.

EXAMPLE 6

Figure 12:
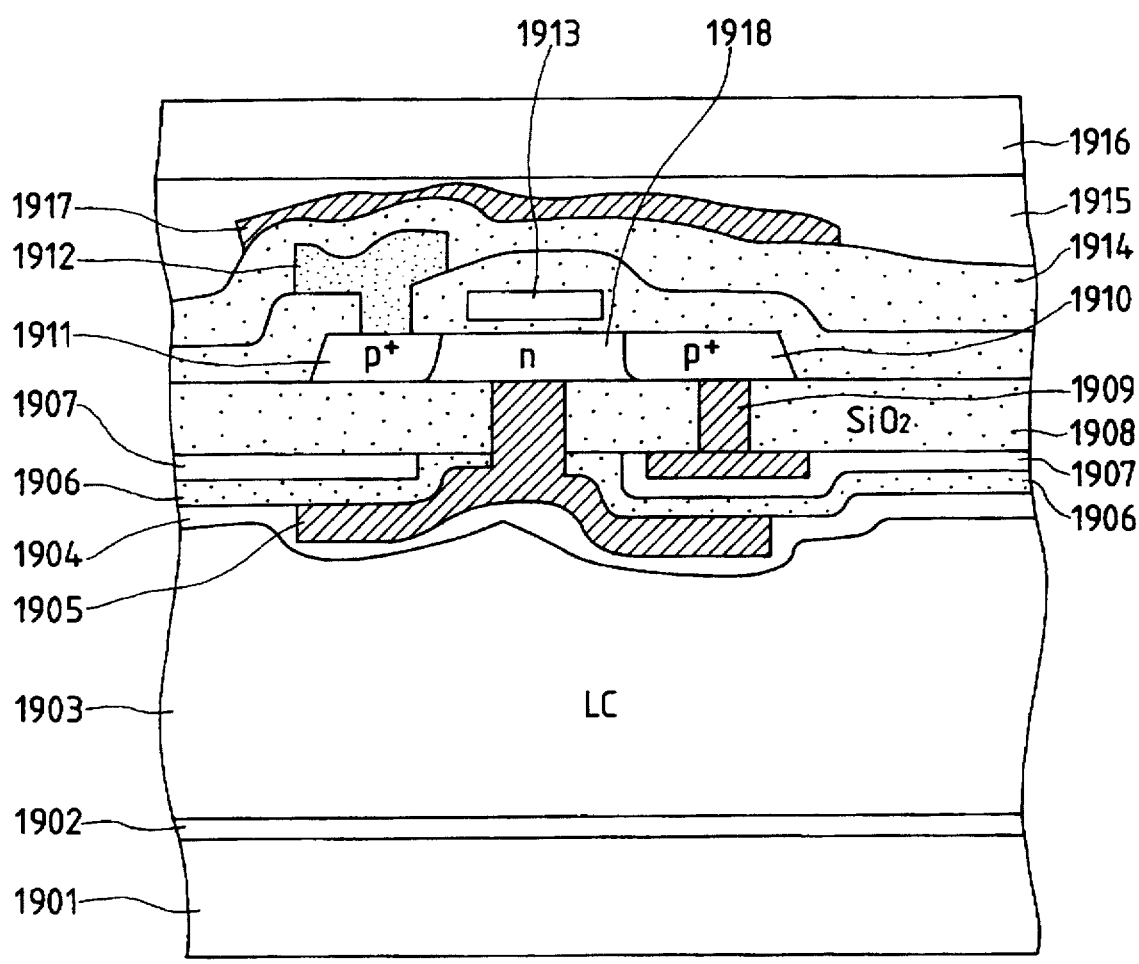
FIG. 12 is a schematic view illustrating another embodiment of a constitution of the liquid crystal display of the present invention.

Description will be made with reference to FIG. 12. FIG. 12 is a schematic view of a liquid crystal display of this embodiment. In FIG. 12, reference numeral 1901 is a facing substrate, numeral 1902 is a layer comprising a color filter, a shading film (black stripes), a facing electrode, an orientation film and the like arranged on the substrate.

Reference numeral 1903 is a liquid crystal layer, numeral 1904 is an orientation film, 1905 is a wire for fixing a well potential of a TFT and is formed on the side of the liquid layer from the well 1918 via an insulating layer 1908. Numeral 1906 is an insulating layer, and 1907 is a transparent electrode which becomes a pixel electrode. This pixel electrode is connected to a drain 1910 of the TFT by an electrode 1909. Numeral 1911 is a source region of the TFT, 1912 is a signal line wire, 1913 is a gate of the TFT, and 1914 is an interlayer insulating layer. Numeral 1917 is a shading layer, and 1915 is a resin for sticking a glass substrate 1916 and a thin film having the TFT together.

As understood from FIG. 12, the wire 1905 for fixing the well potential of the TFT and the pixel electrode 1907 form a capacitor via an insulating layer 1906, whereby the potential of the pixel electrode becomes extremely stable and a good pixel display could be realized. In addition, the wire 1905 for fixing the well potential of the TFT cut external light from an LC side, and therefore the shading of the TFT is possible on both the sides of the TFT by the shading layer 1917 and the wire 1905 for fixing the well potential.

What is claimed is:

1. A liquid crystal display comprising:

an active matrix circuit board equipped with a plurality of transistors having a plurality of pixel electrodes arranged along a plurality of lines and rows and drains connected to these pixel electrodes, scanning lines for commonly connecting gates of said transistors arranged along said lines, and signal lines for commonly connecting sources of said transistors arranged along said rows;

a substrate having a facing electrode; and a liquid crystal interposed between said active matrix circuit board and said substrate, wherein a voltage is applied to regions of a conductive mode which is different from a conductive mode of said sources and said drains of semiconductor layers constituting said transistors through high impurity concentration regions provided at a periphery of the regions of the different conductive mode.

2. The liquid crystal display according to claim 1, wherein the source and drain regions of said transistors are not installed at the edges of the semiconductor layers forming said transistors.

3. The liquid crystal display according to claim 1, wherein metal layers cover the edges of the semiconductor layers forming said transistors.

4. The liquid crystal display according to claim 1, wherein the application of the voltage to said regions is carried out via semiconductor layers other than the semiconductor layers having the same conductive mode as in said regions and containing said regions.

5. The liquid crystal display according to claim 1, wherein each wire of said gates is divided into plural portions at the edge of said semiconductor layer.

6. The liquid crystal display according to claim 1, wherein said semiconductor layers are made up of polycrystalline silicon or single crystalline silicon.

7. The liquid crystal display according to claim 6, wherein the thickness of said semiconductor layers made of said polycrystalline silicon is in the range of from 100 to 700 Å.

8. The liquid crystal display according to claim 6, wherein the thickness of said semiconductor layers made of said single crystalline silicon is in the range of from 1000 to 8000 Å.

9. The liquid crystal display according to claim 1, wherein said transistors are thin film transistors.

10. The liquid crystal display according to claim 9, wherein the central portions of said sources and the central portions of said drains are made up of $p^+$ layers.

11. The liquid crystal display according to claim 10, wherein $p^+$ layers are arranged in peripheries of the central portions of said sources and the central portions of said drains.

12. The liquid crystal display according to claim 11, wherein $p^-$ layers are arranged between said sources and said gates and between said drains and the gates.

13. The liquid crystal display according to claim 9, wherein $n^+$ layers are arranged in peripheries of regions constituting said thin film transistors of said semiconductor layers.

14. The liquid crystal display according to claim 13, wherein said $n^+$ layers are connected to a power source.

15. The liquid crystal display according to claim 14, wherein said $n^+$ layers are arranged along said signal lines.

16. The liquid crystal display according to claim 14, wherein said $n^+$ layers are arranged along said scanning lines.

17. The liquid crystal display according to claim 6, wherein said gates are made of polycrystalline silicon.

18. The liquid crystal display according to claim 1, wherein the application of said voltage is carried out via wires incorporated into said active matrix circuit board.

19. The liquid crystal display according to claim 18, wherein said wires have a shading function for said transistors.

20. A liquid crystal display comprising:

an active matrix circuit board equipped with a plurality of transistors having a plurality of pixel electrodes arranged along a plurality of lines and rows and drains connected to the pixel electrodes, scanning lines for commonly connecting gates of said transistors arranged along said lines, and signal lines for commonly connecting sources of said transistors arranged along said rows;

a substrate having a facing electrode; and a liquid crystal interposed between said active matrix circuit board and said substrate;

a plurality of capacitors each corresponding to a respective one of said transistors, each said capacitor having first and second electrodes, the second electrode being connected to the drain of the corresponding transistor, wherein a voltage is applied to regions of a conductive mode which is different from a conductive mode of said sources and said drains of semiconductor layers constituting said transistors, the first electrode of each capacitor being connected to respective ones of said regions, and wherein said voltage is also applied to respective first electrodes and another voltage is applied to respective second electrodes.

21. A liquid crystal display comprising:

an active matrix circuit board equipped with a plurality of transistors having a plurality of pixel electrodes arranged along a plurality of lines and rows and drains connected to the pixel electrodes, scanning lines for commonly connecting gates of said transistors arranged along said lines, and signal lines for commonly connecting sources of said transistors arranged along said rows;

a substrate having a facing electrode; and a liquid crystal interposed between said active matrix circuit board and said substrate, wherein a voltage is applied to regions of a conductive mode which is different from a conductive mode of said sources and said drains of semiconductor layers constituting said transistors, and the application of said voltage is carried out via layers containing at least semiconductor layers having the same conductive mode as in said regions.

* * * * *

UNITED STATES PATENT AND TRADEMARK OFFICE
CERTIFICATE OF CORRECTION

PATENT NO. : 5,717,473

DATED : February 10, 1998

INVENTOR(S) : MAMORU MIYAWAKI

It is certified that error appears in the above-identified patent and that said Letters Patent is hereby corrected as shown below:

COLUMN 2

Line 26, "terminals" should read --terminal--.

COLUMN 3

Line 55, "include" should read --includes--.

COLUMN 5

Line 8, "A1" should read --Al--; and
    Line 9, "A1-Si, A1-Si-Cu" should read --Al-Si, Al-Si-Cu--.

COLUMN 6

Line 29, "A1, A1-Si" should read --Al, Al-Si--.

COLUMN 7

Line 43, "the less" should read --less--.

COLUMN 8

Line 54, "capacitance" should read --capacitor--.

COLUMN 9

Line 14, "serial" should read --series--.

UNITED STATES PATENT AND TRADEMARK OFFICE
CERTIFICATE OF CORRECTION

PATENT NO. : 5,717,473

DATED : February 10, 1998

INVENTOR(S) : MAMORU MIYAWAKI

It is certified that error appears in the above-identified patent and that said Letters Patent is hereby corrected as shown below:

COLUMN 11

Line 19, "Al-Si, Al-Si-Cu" should read
--Al-Si, Al-Si-Cu--;
Line 34, "10" should be deleted;
Line 62, "displaying" should read --display--; and
Line 65, "sectional" should read --sectional view--.

COLUMN 12

Line 3, "was" should read --that was--;
Line 6, "plurality" should read --plurality of--;
Line 14, "any blank area was not" should read
--no blank area was--;
Line 22, "lines of" should be deleted; and
Line 23, "$p^{30}$" should read --$p^+$--.

COLUMN 13

Line 44, "A1" should read --Al-- and
"sire" should read --wire--; and
Line 54, "farther high" should read --yet higher--.

Signed and Sealed this

Tenth Day of November 1998

BRUCE LEHMAN

Attest:

Attesting Officer

Commissioner of Patents and Trademarks